United States Patent
Son et al.

(10) Patent No.: US 11,715,786 B2
(45) Date of Patent: Aug. 1, 2023

(54) INTEGRATED CIRCUIT DEVICE AND METHOD OF MANUFACTURING THE SAME

(71) Applicant: SAMSUNG ELECTRONICS CO., LTD., Suwon-si (KR)

(72) Inventors: Nak-jin Son, Suwon-si (KR); Dong-il Bae, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 14 days.

(21) Appl. No.: 17/375,189

(22) Filed: Jul. 14, 2021

(65) Prior Publication Data

US 2021/0343859 A1 Nov. 4, 2021

Related U.S. Application Data

(63) Continuation of application No. 16/590,820, filed on Oct. 2, 2019, now Pat. No. 11,094,800.

(30) Foreign Application Priority Data

Mar. 20, 2019 (KR) .................. 10-2019-0031774

(51) Int. Cl.
*H01L 29/66* (2006.01)
*H01L 29/06* (2006.01)
*H01L 29/10* (2006.01)
*H01L 29/423* (2006.01)
*B82Y 10/00* (2011.01)

(52) U.S. Cl.
CPC .... *H01L 29/66795* (2013.01); *H01L 29/0673* (2013.01); *H01L 29/1033* (2013.01); *H01L 29/42392* (2013.01); *B82Y 10/00* (2013.01)

(58) Field of Classification Search
CPC combination set(s) only.
See application file for complete search history.

(56) References Cited

U.S. PATENT DOCUMENTS

| | | | |
|---|---|---|---|
| 7,800,172 B2 | 9/2010 | Lee et al. | |
| 8,129,777 B2 | 3/2012 | Kim et al. | |
| 8,753,942 B2 | 6/2014 | Kuhn et al. | |
| 9,159,787 B2 | 10/2015 | Rachmady et al. | |

(Continued)

*Primary Examiner* — Moin M Rahman
*Assistant Examiner* — Mohammad A Rahman
(74) *Attorney, Agent, or Firm* — F. Chau & Associates, LLC

(57) ABSTRACT

An integrated circuit device includes: a fin-type active area including a fin top surface on a top portion and an anti-punch-through recess having a lowermost level lower than a level of the fin top surface; a nanosheet stack facing the fin top surface, the nanosheet stack including a plurality of nanosheets having vertical distances different from each other from the fin top surface; a gate structure surrounding each of the plurality of nanosheets; a source/drain region having a side wall facing at least one of the plurality of nanosheets; and an anti-punch-through semiconductor layer including a first portion filling the anti-punch-through recess, and a second portion being in contact with a side wall of a first nanosheet most adjacent to the fin-type active area among the plurality of nanosheets, the anti-punch-through semiconductor layer including a material different from a material of the source/drain region.

9 Claims, 35 Drawing Sheets

(56) References Cited

U.S. PATENT DOCUMENTS

| | | |
|---|---|---|
| 9,263,520 B2 | 2/2016 | Liu et al. |
| 9,608,069 B1 | 3/2017 | Basker et al. |
| 10,109,717 B2 | 10/2018 | Lee et al. |
| 10,121,870 B1 | 11/2018 | Chiang et al. |
| 10,164,012 B2 | 12/2018 | Fung et al. |
| 2012/0205777 A1 | 8/2012 | Lee |
| 2014/0312393 A1 | 10/2014 | Rodder et al. |
| 2017/0365604 A1 | 12/2017 | Suh et al. |
| 2018/0294331 A1* | 10/2018 | Cho .................. H01L 29/41725 |
| 2019/0348403 A1* | 11/2019 | Mochizuki .......... H01L 21/0245 |
| 2020/0044087 A1* | 2/2020 | Guha .............. H01L 21/823864 |
| 2020/0303521 A1 | 9/2020 | Son et al. |

* cited by examiner

INTEGRATED CIRCUIT DEVICE AND METHOD OF MANUFACTURING THE SAME

CROSS-REFERENCE TO RELATED APPLICATION

This application is a continuation of U.S. application Ser. No. 16/590,820, filed on Oct. 2, 2019, which claims the benefit under 35 U.S.C. § 119 of Korean Patent Application No. 10-2019-0031774, filed on Mar. 20, 2019, in the Korean Intellectual Property Office, the disclosures of which are incorporated by reference herein in their entirety.

TECHNICAL FIELD

The present inventive concept relates to an integrated circuit device and a method of manufacturing the same, and more particularly, to an integrated circuit device including a horizontal nanosheet field-effect transistor (hNSFET) and a method of manufacturing the same.

DISCUSSION OF RELATED ART

As the size of the integrated circuit device decreases, it is desirable to increase the degree of integration of the field-effect transistor on a substrate, and accordingly, a horizontal nanosheet field-effect transistor (hNSFET) including a plurality of horizontal nanosheets serving as channel regions stacked on the same layout area has been developed. In the hNSFET structure, transistors at an uppermost level are configured in a gate-all-around (GAA) structure, but transistors at a lowermost level may include planar transistors which are susceptible to short channel effects (SCE). Thus, as the degree of integration of semiconductor devices increases and the size of the semiconductor devices is significantly reduced, development of a new structure capable of suppressing deterioration of electrical characteristics due to SCE, punch-through, etc. in the hNSFET may be required.

SUMMARY

The present inventive concept provides an integrated circuit device capable of minimizing leakage current and junction capacitance and effectively preventing unwanted punch-through by forming an anti-punch-through semiconductor layer on a bottom portion of a source/drain region, and a method of manufacturing the integrated circuit device.

According to an aspect of the present inventive concept, there is provided an integrated circuit device including: a fin-type active area including a fin top surface on a top portion and an anti-punch-through recess having a lowermost level lower than a level of the fin top surface; a nanosheet stack facing the fin top surface at a location apart from the fin top surface, the nanosheet stack including a plurality of nanosheets having vertical distances different from each other from the fin top surface; a gate structure surrounding each of the plurality of nanosheets; a source/drain region having a side wall facing at least one of the plurality of nanosheets; an anti-punch-through semiconductor layer including a first portion filling the anti-punch-through recess, and a second portion being in contact with a side wall of a first nanosheet most adjacent to the fin-type active area among the plurality of nanosheets, the anti-punch-through semiconductor layer including a material different from a material of the source/drain region.

According to another aspect of the present inventive concept, there is provided an integrated circuit device including: a fin-type active area protruding from a substrate, extending in a first horizontal direction, and having a fin top surface; a pair of nanosheet stacks facing the fin top surface at a location apart from the fin top surface, the pair of nanosheet stacks each including a plurality of nanosheets having vertical distances different from each other from the fin top surface; a pair of gate structures respectively covering the pair of nanosheet stacks and extending in a second horizontal direction perpendicular to the first horizontal direction; a source/drain region disposed between the pair of nanosheet stacks; an anti-punch-through recess formed in a top portion of the fin-type active area between the pair of nanosheet stacks, and having a bottom surface thereof at a level lower than a level of the fin top surface; and an anti-punch-through semiconductor layer including a first portion filling the anti-punch-through recess between the fin-type active area and the source/drain region, the anti-punch-through semiconductor layer including a material different from a material of the source/drain region.

According to another aspect of the present inventive concept, there is provided an integrated circuit device including: a first fin-type active area protruding from a substrate in a first region of the substrate, and having a first fin top surface on a top portion thereof and a first anti-punch-through recess having a lowermost level lower than a level of the first fin top surface; a first nanosheet stack facing the first fin top surface and including a plurality of nanosheets; a first gate structure covering the first nanosheet stack; a first source/drain region having a side wall facing the first nanosheet stack; a first anti-punch-through semiconductor layer filling the first anti-punch-through recess between the first fin-type active area and the first source/drain region, the first anti-punch-through semiconductor layer including a material different from a material of the first source/drain region; a second fin-type active area protruding from the substrate in a second region of the substrate, and having a second fin top surface on a top portion thereof and a second anti-punch-through recess having a lowermost level lower than a level of the second fin top surface; a second nanosheet stack facing the second fin top surface and including a plurality of nanosheets; a second gate structure covering the second nanosheet stack; a second source/drain region having a side wall facing the second nanosheet stack, and a second anti-punch-through semiconductor layer filling the second anti-punch-through recess between the second fin-type active area and the second source/drain region, the second anti-punch-through semiconductor layer including a material different from a material of the second source/drain region, in which a first lowermost level of the first anti-punch-through semiconductor layer is different from a second lowermost level of the second anti-punch-through semiconductor layer.

According to another aspect of the present inventive concept, there is provided a method of manufacturing an integrated circuit device, the method including: forming a fin-type active area protruding from a substrate and having a fin top surface, and a nanosheet stack facing the fin top surface at a location apart from the fin top surface and including a plurality of nanosheets; forming an anti-punch-through recess including a bottom surface thereof at a level lower than a level of the fin top surface by etching the fin-type active area on one side of the nanosheet stack; forming an anti-punch-through semiconductor layer filling the anti-punch-through recess and covering a side wall of at least one of the plurality of nanosheets; and forming a source/drain region on the anti-punch-through semiconductor layer, the source/drain region including a material different from a material of the anti-punch-through semiconductor layer.

BRIEF DESCRIPTION OF THE DRAWINGS

Exemplary embodiments of the present inventive concept will be more clearly understood from the following detailed description taken in conjunction with the accompanying drawings in which:

FIGS. 3A and 3B are cross-sectional views of an integrated circuit device according to an exemplary embodiment of the present inventive concept, in which FIG. 3A is an enlarged cross-sectional view of a region corresponding to a local region indicated by "X1" in FIG. 2A, and FIG. 3B is a cross-sectional view of a portion corresponding to a cross-section taken along line Y-Y' of FIG. 1;

FIGS. 4A and 4B are cross-sectional views of an integrated circuit device according to an exemplary embodiment of the present inventive concept, in which FIG. 4A is an enlarged cross-sectional view of a region corresponding to a local region indicated by "X1" in FIG. 2A, and FIG. 4B is a cross-sectional view of a portion corresponding to a cross-section taken along Y-Y' of FIG. 1;

Figure 1:
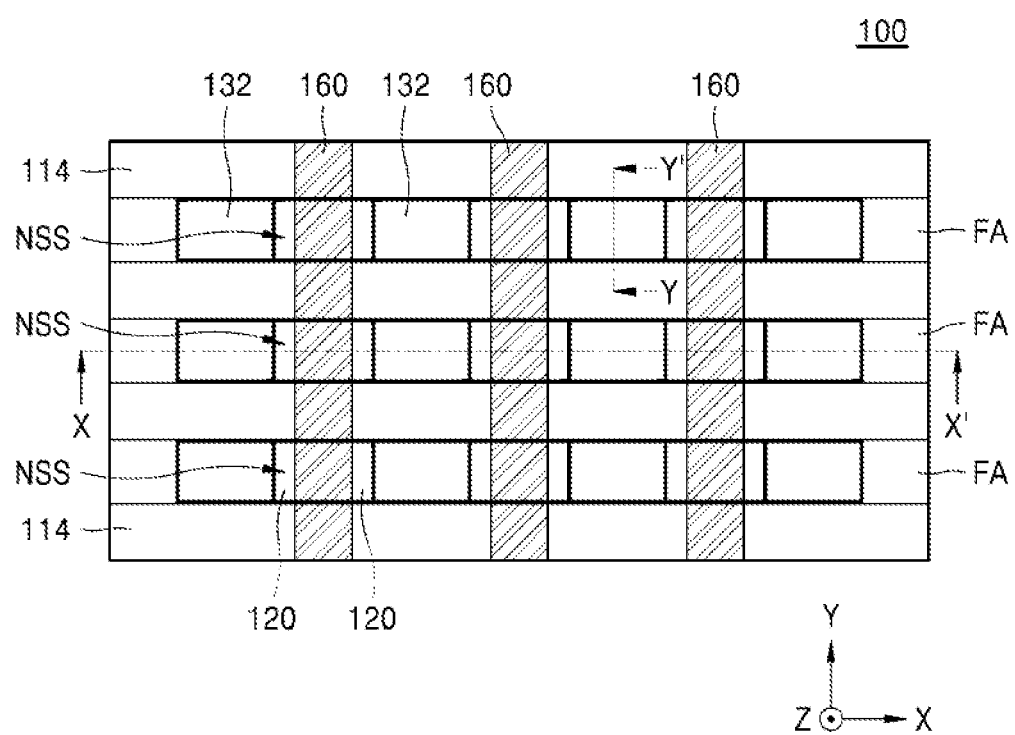
FIG. 1 is a plan layout diagram of some components of an integrated circuit device, according to an exemplary embodiment of the present inventive concept.

Since the drawings in FIGS. 1-27B are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, exemplary embodiments of the present inventive concept will be described in detail with reference to the accompanying drawings. Identical reference numerals are used for the same constituent elements in the drawings, and a duplicate description thereof will be omitted.

Figure 2A:
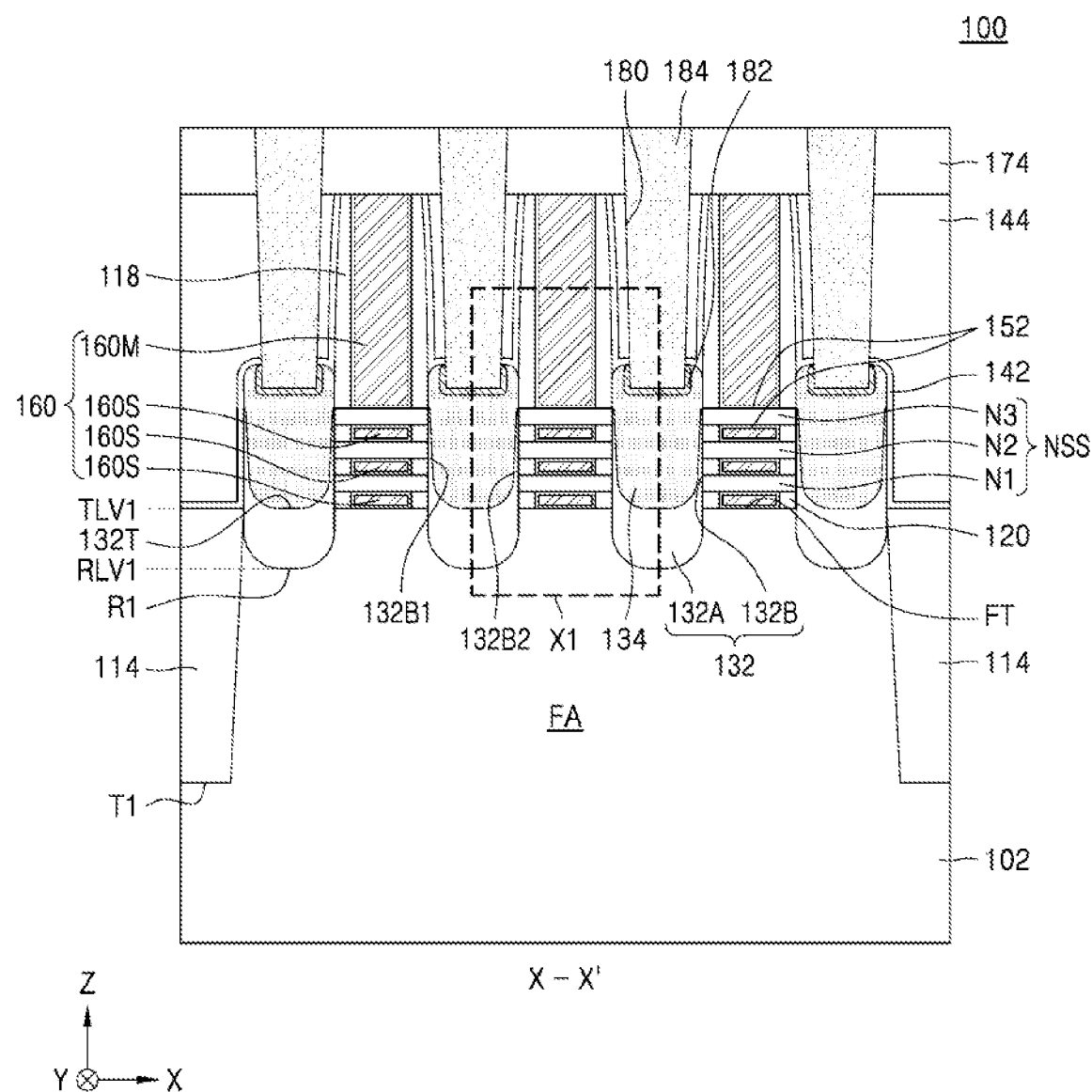
FIG. 2A is a cross-sectional view taken along line X-X' in FIG. 1.
Figure 2B:
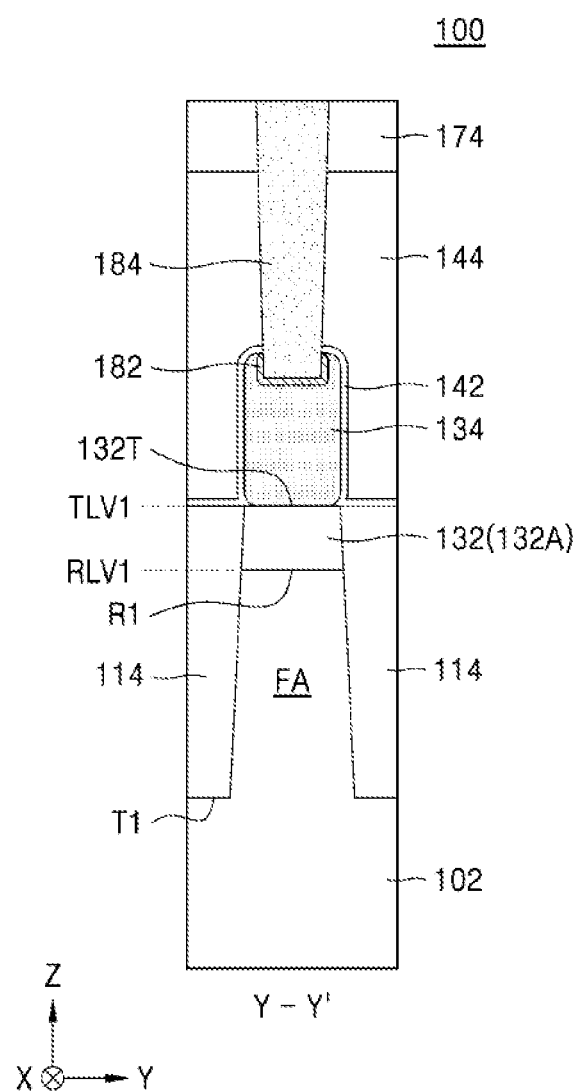
FIG. 2B is a cross-sectional view taken along line Y-Y' in FIG. 1.

FIG. 1 is a plan layout diagram of some components of an integrated circuit device 100, according to an exemplary embodiment of the present inventive concept, FIG. 2A is a cross-sectional view taken along line X-X' in FIG. 1, and FIG. 2B is a cross-sectional view taken along line Y-Y' in FIG. 1.

Referring to FIGS. 1, 2A, and 2B, the integrated circuit device 100 may include a plurality of fin-type active areas FA protruding from a substrate 102 and extending in a first horizontal direction (X direction), and a plurality of nanosheet stacks NSS facing fin top surfaces FT of the plurality of fin-type active areas FA at positions apart from the plurality of fin-type active areas FA.

The substrate 102 may include a semiconductor such as, for example, silicon (Si) or germanium (Ge), or a compound semiconductor such as, for example, silicon germanium (SiGe), silicon carbide (SiC), gallium arsenide (GaAs), indium arsenide (InAs), indium phosphide (InP), gallium phosphide (GaP), or indium gallium arsenide (InGaAs). In an exemplary embodiment of the present inventive concept, the substrate 102 may be a silicon-on-insulator (SOI) substrate, or a germanium-on-insulator (GOI) substrate. The substrate 102 may include a trench T1 defining the plurality of fin-type active areas FA, and the trench T1 may be filled with a device isolation layer 114. Thus, the device isolation layers 114 may define the plurality of fin-type active areas FA. The device isolation layer 114 may include, for example, an oxide layer, a nitride layer, or a combination thereof. In an exemplary embodiment of the present inventive concept, the device isolation layer 114 may include an insulating layer, such as, for example, silicon oxide ($SiO_2$), silicon nitride ($Si_3N_4$), silicon oxynitride (SiON), or a combination thereof.

A plurality of gate lines 160 may be spaced apart from each other in the first horizontal direction (X direction), and may extend in a second horizontal direction (Y direction) intersecting the first horizontal direction (X direction) on the plurality of fin-type active areas FA. The second horizontal direction (Y direction) may be perpendicular to the first horizontal direction (X direction). A plurality of nanosheet stacks NSS may be disposed on the fin top surface FT of each of the plurality of fin-type active areas FA in areas where the plurality of fin-type active areas FA and the plurality of gate lines 160 cross each other. The plurality of nanosheet stacks NSS may face the fin top surfaces FT at locations apart from the fin top surfaces FT of the fin-type active area FA. Each of the plurality of nanosheet stacks NSS may include a plurality of nanosheets (N1, N2, and N3), each of which extends in parallel with the fin top surface FT of the fin-type active area FA and has a different vertical distance (distance in a Z direction) from the fin top surface FT. For example, the plurality of nanosheets (N1, N2, and N3) may be formed at a plurality of levels, respectively, to be spaced apart from each other in a vertical direction (Z direction) from the fin top surface FT of the fin-type active area FA. The term "level" used herein may indicate a distance in the vertical direction (Z direction or –Z direction) from a top surface of the substrate 102. The plurality of nanosheets (N1, N2, and N3) may include a first nanosheet N1, a second nanosheet N2, and a third nanosheet N3, which are sequentially stacked on the fin top surface FT of the fin-type active area FA. Thus, first nanosheet N1 is closest to the fin top surface FT of the fin-type active area FA among the plurality of nanosheets (N1, N2, and N3).

In FIG. 1, the case where a planar shape of the nanosheet stack NSS has a substantially rectangular shape is exemplified, but the present inventive concept is not limited thereto. For example, the nanosheet stack NSS may have various planar shapes according to a planar shape of each of the fin-type active areas FA and the plurality of gate lines 160. In the present exemplary embodiment, the plurality of nanosheet stacks NSS and the plurality of gate lines 160 may be formed on one fin-type active area FA, and a configuration is illustrated in which the plurality of nanosheet stacks NSS are arranged on one fin-type active area FA in a line in the first horizontal direction (X direction). In the present exemplary embodiment, a configuration with three nanosheet stacks formed on one fin-type active area FA is exemplified. However, according to the present inventive concept, the number of nanosheet stacks NSS on one fin-type active area FA may not be particularly limited. For example, one nanosheet stack NSS may be formed on one fin-type active area FA. In the present exemplary embodiment, the case where each of the plurality of nanosheet stacks NSS includes three nanosheets (N1, N2, and N3) is exemplified, but the present inventive concept is not limited thereto. For example, the nanosheet stack NSS may include at least two nanosheets, and the number of nanosheets constituting the nanosheet stack NSS is not particularly limited.

Each of the plurality of nanosheets (N1, N2, and N3) may have a channel region. In an exemplary embodiment of the present inventive concept, each of the plurality of nanosheets (N1, N2, and N3) may have a thickness in the vertical direction (Z direction) selected in a range from about 4.5 nm to about 5.5 nm, however, the present inventive concept is not limited thereto. In an exemplary embodiment of the present inventive concept, the plurality of nanosheets (N1, N2, and N3) may have substantially the same thickness. The plurality of nanosheets (N1, N2, and N3) may include the same material. In an exemplary embodiment of the present inventive concept, the plurality of nanosheets (N1, N2, and N3) may include a material the same as that of the substrate 102. However, any suitable material may be used, and may be different from that of the substrate 102. For example, silicon (Si), germanium (Ge), or silicon germanium (SiGe) may be a suitable material for the plurality of nanosheets (N1, N2, and N3). Alternatively, a III-V compound semiconductor may be used for the plurality of nanosheets (N1, N2, and N3).

The gate line 160 may surround each of the plurality of nanosheets (N1, N2, and N3) while covering the nanosheet stack NSS on the fin-type active area FA. Each of the plurality of gate lines 160 may include a main gate portion 160M which covers a top surface of the nanosheet stack NSS and extends in the second horizontal direction (Y direction), and a plurality of sub-gate portions 160S which are integrally connected to the main gate portion 160M and each arranged between two adjacent ones of the plurality of nanosheets (N1, N2, and N3) and between the fin-type active area FA and the first nanosheet N1. In the vertical direction (Z direction), the thickness of each of the plurality of sub-gate portions 160S may be less than the thickness of the main gate portion 160M. The plurality of nanosheets (N1, N2, and N3) may have a gate-all-around (GAA) structure in which they are completely surrounded by the gate line 160. For example, the gate line 160 may surround the top surface, the bottom surface and the side surfaces of a respective nanosheet (N1, N2, or N3), with the respective nanosheet (N1, N2, or N3) located in the center.

The gate line 160 may include, for example, a metal, a metal nitride, a metal carbide, or a combination thereof. The metal may be selected from, for example, titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from, for example, titanium nitride (TiN) and tantalum nitride (TaN). The metal carbide may include titanium aluminum carbide (TiAlC).

A gate dielectric layer 152 may be formed between the nanosheet stack NSS and the gate line 160. A gate structure may include the gate line 160 and the gate dielectric layer 152. Thus, the gate structure may surround each of the plurality of nanosheets (N1, N2, and N3), while covering the nanosheet stack NSS on the fin-type active area FA.

In an exemplary embodiment of the present inventive concept, the gate dielectric layer 152 may have a stacked structure of an interfacial layer and a high-k dielectric layer. The interfacial layer may include a low dielectric material layer having a dielectric constant of about 9 or less, for example, a silicon oxide ($SiO_2$) layer, a silicon oxynitride (SiON) film, or a combination thereof. In an exemplary embodiment of the present inventive concept, the interfacial layer may be omitted. The high-k dielectric layer may include a material having a dielectric constant greater than that of the silicon oxide ($SiO_2$) layer. For example, the high-k dielectric layer may have a dielectric constant of about 10 to about 25. The high-k dielectric layer may include hafnium oxide ($HfO_2$), but the present inventive concept is not limited thereto. For example, the high-k dielectric material may be formed of or include at least one of, for example, hafnium oxide ($HfO_2$), hafnium silicon oxide ($HfSiO_4$), lanthanum oxide ($La_2O_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), or lead zinc niobate ($Pb(Zn_{1/3}Nb_{2/3})O_3$).

A plurality of anti-punch-through recesses R1 may be respectively formed on top of the fin-type active areas FA. Punch-through may be associated with the merging of source and drain regions through the formation of a conductive path or leakage current between the source and drain regions. A lowermost level RLV1 of the plurality of anti-punch-through recesses R1 may be lower than a level of the fin top surface FT of the fin-type active area FA, and may be lower than a level of a top surface of the device isolation layer 114.

The plurality of anti-punch-through recesses R1 may be respectively filled with a plurality of anti-punch-through semiconductor layers 132. The plurality of anti-punch-through semiconductor layers 132 may be on each side of each of the nanosheet stacks NSS.

In an exemplary embodiment of the present inventive concept, the plurality of anti-punch-through semiconductor layers 132 may each include an undoped semiconductor layer. For example, the plurality of anti-punch-through semiconductor layers 132 may each include an undoped Si layer or an undoped SiGe layer. In an exemplary embodiment of the present inventive concept, the plurality of anti-punch-through semiconductor layers 132 may each include a semiconductor layer which is doped with a dopant of a conductivity type opposite to a conductivity type of channels of transistors to be implemented on the fin-type active area FA. When an n-channel metal-oxide semiconductor (NMOS) transistor is to be implemented on the fin-type active area FA, the anti-punch-through semiconductor layer 132 may include a Si layer or a SiGe layer doped with a p-type dopant such as, for example, boron (B) and/or indium (In). When a p-channel metal-oxide semiconductor (PMOS) transistor is to be implemented on the fin-type active area FA, the anti-punch-through semiconductor layer 132 may include a Si layer or a SiGe layer doped with an n-type dopant such as phosphorus (P) and/or arsenic (As).

Each of the plurality of anti-punch-through semiconductor layers 132 may include a first portion 132A filling the anti-punch-through recess R1, and a second portion 132B extending upward from the first portion 132A and covering at least some of side walls of the plurality of nanosheets (N1, N2, and N3) outside the anti-punch-through recess R1. For example, the second portion 132B may be in contact with at least the side wall of the first nanosheet N1 most adjacent to the fin-type active area FA among the plurality of nanosheets (N1, N2, and N3).

The plurality of anti-punch-through semiconductor layers 132 may be formed to have a non-conformal thickness on an inner wall of each of the anti-punch-through recesses R1 and on the respective side walls of the plurality of nanosheets (N1, N2, and N3). The plurality of anti-punch-through semiconductor layers 132 may be formed such that the thickness of a portion covering the inner wall of each of the anti-punch-through recesses R1 is greater than the thickness of a portion covering respective side walls of the plurality of nanosheets (N1, N2, and N3).

The anti-punch-through semiconductor layer 132 between an adjacent pair of nanosheet stacks NSS may include two second portions 132B that are integrally connected to the first portion 132A, and may have a U-shape on a cross-section in a horizontal direction (for example, the first horizontal direction, i.e., the X direction). The two second portions 132B may include a first vertical extension portion 132B1 contacting a side wall of at least one nanosheet (N1, N2 or N3) included in one nanosheet stack NSS selected from the adjacent pair of nanosheet stacks NSS (N1, N2, and N3), and a second vertical extension portion 132B2 contacting a side wall of at least one nanosheet (N1, N2 or N3) included in the other nanosheet stack NSS selected from the adjacent pair of nanosheet stacks NSS (N1, N2, and N3). For example, the first vertical extension portion 132B1 and second vertical extension portion 132B2 may each be in contact with at least a side wall of the first nanosheet N1 in each of the adjacent pair of nanosheet stacks NSS (N1, N2, and N3).

On top surfaces 132T of the plurality of anti-punch-through semiconductor layers 132, a level TLV1 of a portion that vertically overlaps a lowermost portion at a lowermost level among the inner walls of the anti-punch-through recess R1 may be equal to or lower than a level of the fin top surface FT of the fin-type active area FA. Since TLV1 is a level of a part of the top surface of the first portion 132A, a level of the top surface of the first portion 132A of the anti-punch-through semiconductor layer 132 may be equal to or lower than the level of the fin top surface FT. The level TLV1 may be equal to or lower than a level of a top surface of the device isolation layer 114. In FIG. 2B, the top surface 132T of the anti-punch-through semiconductor layer 132 is illustrated as extending flat in the second horizontal direction (Y direction), but the present inventive concept is not limited thereto. For example, the top surface 132T of the anti-punch-through semiconductor layer 132 may be curved in the second horizontal direction (Y direction).

The second portion 132B of each of the plurality of anti-punch-through semiconductor layers 132 may cover the side walls of the plurality of nanosheets (N1, N2, and N3) except the first nanosheet N1, which is most adjacent to the fin-type active area FA, for example, the inner walls of the second and third nanosheets N2 and N3 to a thickness of about 2 nm or less, for example, to a thickness of about 1 nm or less. When the anti-punch-through semiconductor layer 132 covers at least a portion of the plurality of nanosheets (N1, N2, and N3) to a thickness of about 2 nm or less, the influence on electrical characteristics of the transistor including the plurality of nanosheets (N1, N2, and N3) may be reduced. For example, the transistors including the second and third nanosheets N2 and N3 and having gate-all-around (GAA) structures may maintain good electrical characteristics, when the second portion 132B covers the sidewall of the second and third nanosheets N2 and N3 to a thickness of about 2 nm or less. In an exemplary embodiment of the present inventive concept, the second portion 132B of each of the plurality of anti-punch-through semiconductor layers 132 may cover the sidewall of the first nanosheet N1 to a thickness of about 2 nm or greater. For example, the transistors below the first nanosheets N1 at the lowermost sub-gate portions 160S may be planar transistors, and may be capable of suppressing deterioration of electrical characteristics due to short channel effects (SCE), punch-through, etc., when the second portion 132B covers the sidewall of the first nanosheet N1 to a thickness of about 2 nm or greater. The thickness of the second portion 132B of each of the plurality of anti-punch-through semiconductor layers 132 may gradually become greater toward the first portion 132A.

A plurality of source/drain regions 134 may be formed on the plurality of anti-punch-through semiconductor layers 132. The plurality of source/drain regions 134 may respectively contact the anti-punch-through semiconductor layers 132. A level, for example, a lowermost level of an interface between the anti-punch-through semiconductor layer 132 and the source/drain region 134 may be equal to or lower than the level of the fin-type top surface FT of the fin-type active area FA. The lowermost level of the interface between the anti-punch-through semiconductor layer 132 and the source/drain region 134 may be the same as the level TLV1 of the top surfaces 132T of the plurality of anti-punch-through semiconductor layers 132 described above.

The plurality of source/drain regions 134 may face the plurality of nanosheets (N1, N2, and N3), and may be apart from at least a portion of the plurality of nanosheets (N1, N2, and N3) with the second portion 132B of the anti-punch-through semiconductor layer 132 interposed therebetween. For example, the plurality of source/drain regions 134 may each have a side wall facing at least one of the plurality of nanosheets (N1, N2, and N3).

The plurality of source/drain regions 134 may include a material different from a material of the plurality of anti-punch-through semiconductor layers 132. The plurality of source/drain regions 134 may include epitaxially grown semiconductor layers. For example, the plurality of source/drain regions 134 may each include a Si layer, a SiGe layer, or a SiC layer. In an exemplary embodiment of the present inventive concept, the plurality of source/drain regions 134 may include a semiconductor material that is the same as a semiconductor material constituting the plurality of anti-punch-through semiconductor layers 132, but the two semiconductor materials may be of different conductivity types. In an exemplary embodiment of the present inventive concept, the plurality of anti-punch-through semiconductor layers 132 may each include an undoped Si layer or a Si layer doped with a p-type dopant, and the plurality of source/drain regions 134 may each include a Si layer doped with an n-type dopant. In an exemplary embodiment of the present inventive concept, the plurality of anti-punch-through semiconductor layers 132 may each include an undoped SiGe layer or a SiGe layer doped with a p-type dopant, and the plurality of source/drain regions 134 may each include a SiGe layer doped with an n-type dopant.

In an exemplary embodiment of the present inventive concept, the plurality of source/drain regions 134 may include a plurality of semiconductor layers each having a dopant concentration different from that of the others. For example, each of the plurality of source/drain regions 134 may have a relatively low dopant concentration toward the anti-punch-through semiconductor layer 132, and a relatively high dopant concentration away from the anti-punch-through semiconductor layer 132. Here, relatively low or relatively high may mean lower or higher, or may mean lower than the average dopant concentration or higher than the average dopant concentration of each of the plurality of source/drain regions 134. Thus, in each of the plurality of source/drain regions 134, the dopant concentration of the portion far from the anti-punch-through semiconductor layer 132 may be higher that the dopant concentration of the portion close to the anti-punch-through semiconductor layer 132.

A metal silicide layer 182 may be formed on a top surface of each of the plurality of source/drain regions 134, and may include, for example, nickel silicide ($NiSi_2$), titanium silicide ($TiSi_2$), tungsten silicide ($WSi_2$), or cobalt silicide ($CoSi_2$), but the present inventive concept is not limited thereto. The metal silicide layer 182 may be omitted.

A plurality of first insulation spacers 118 may be formed over the plurality of nanosheet stacks NSS. A sidewall of the main gate portion 160M of the gate line 160 may be covered with the first insulating spacer 118. The plurality of first insulation spacers 118 and the plurality of source/drain regions 134 may be covered with a protective insulation layer 142. The first insulation spacer 118 and the protective insulation layer 142 may include, for example, silicon nitride ($Si_3N_4$), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), silicon oxide ($SiO_2$), or a combination thereof. However, the present inventive concept is not limited thereto. For example, the protective insulation layer 142 may be omitted.

A plurality of second insulation spacers 120 may be arranged between two adjacent ones of the plurality of nanosheets (N1, N2, and N3), and between the fin-type active area FA and the first nanosheet N1. Both sidewalls of each of the plurality of sub-gate portions 160S may be covered with the second insulation spacer 120 with the gate dielectric layer 152 arranged therebetween. At least some of the plurality of second insulation spacers 120 may be between the second portion 132B of the anti-punch-through semiconductor layer 132 and the sub-gate portion 160S. At least some of the second insulating spacers 120 may face the source/drain regions 134 with the second portion 132B of the anti-punch-through semiconductor layer 132 arranged therebetween.

In an exemplary embodiment of the present inventive concept, the first insulation spacer 118 and the second insulation spacer 120 may include the same material. In an exemplary embodiment of the present inventive concept, the first insulation spacer 118 and the second insulation spacer 120 may include materials different from each other. In an exemplary embodiment of the present inventive concept, the second insulation spacers 120 may include, for example, $Si_3N_4$, SiCN, SiBN, SiON, SiOCN, SiBCN, SiOC, $SiO_2$, or a combination thereof. In an exemplary embodiment of the present inventive concept, the second insulation spacer 120 may include an air gap. In an exemplary embodiment of the present inventive concept, an air gap may be formed between the second insulation spacer 120 and the second portion 132B of the anti-punch-through semiconductor layer 132.

An inter-gate insulation layer 144 and an inter-layer insulation layer 174 may be sequentially formed on the protective insulation layer 142 covering the plurality of source/drain regions 134. The inter-gate insulation layer 144 and the inter-layer insulation layer 174 may include a silicon oxide ($SiO_2$) layer.

A plurality of contact plugs 184 may be formed inside a plurality of contact holes 180 which pass through the inter-layer insulation layer 174, the inter-gate insulation layer 144, and the protective insulation layer 142. The plurality of contact plugs 184 may be connected to the plurality of source/drain regions 134 via the plurality of metal silicide layers 182. Each of the plurality of contact plugs 184 may include, for example, a metal, a conductive metal nitride, or a combination thereof. For example, each of the plurality of contact plugs 184 may include tungsten (W), copper (Cu), aluminum (Al), titanium (Ti), tantalum (Ta), titanium nitride (TiN), tantalum nitride (TaN), an alloy thereof, or a combination thereof.

In the integrated circuit device 100, the anti-punch-through semiconductor layer 132 may be between the fin-type active area FA and the source/drain region 134. A bottom transistor including the sub-gate portion 160S that is closest to the fin top surface FT of the fin-type active area FA among the plurality of sub-gate portions 160S may have an underlapped gate structure due to the anti-punch-through semiconductor layer 132. For example, the underlap length may increase with the increase of the thickness of the second portion 132B covering the sidewall of the second insulation spacer 120 which contacts the sub-gate portion 160S that is closest to the fin top surface FT of the fin-type active area FA among the plurality of sub-gate portions 160S. The effective channel length may increase with the increase of the underlap length. Accordingly, the bottom transistor may operate in an underlapped state to secure a short-channel effects (SCE) margin, and a current in an off-state may be reduced to decrease a leakage current and a junction capacitance. In addition, a punch-through via the fin-type active area FA at a bottom portion of the nanosheet stack NSS may be effectively blocked by the anti-punch-through semiconductor layer 132, and deterioration in electrical characteristics may be suppressed.

Figure 3A:
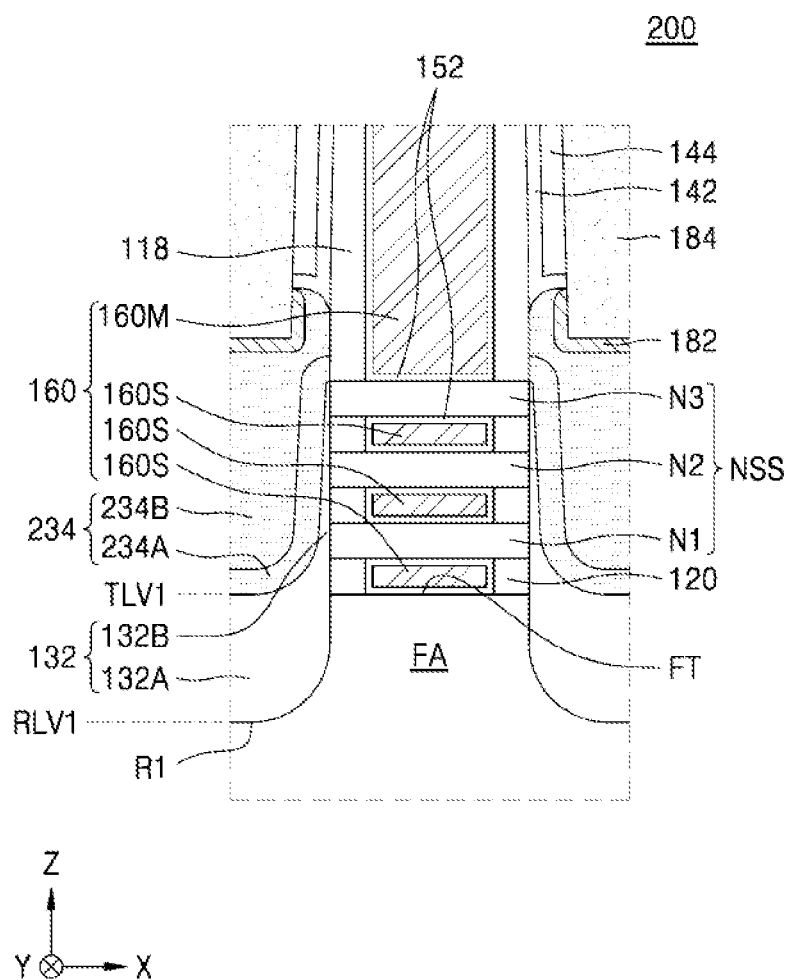
Figure 3B:
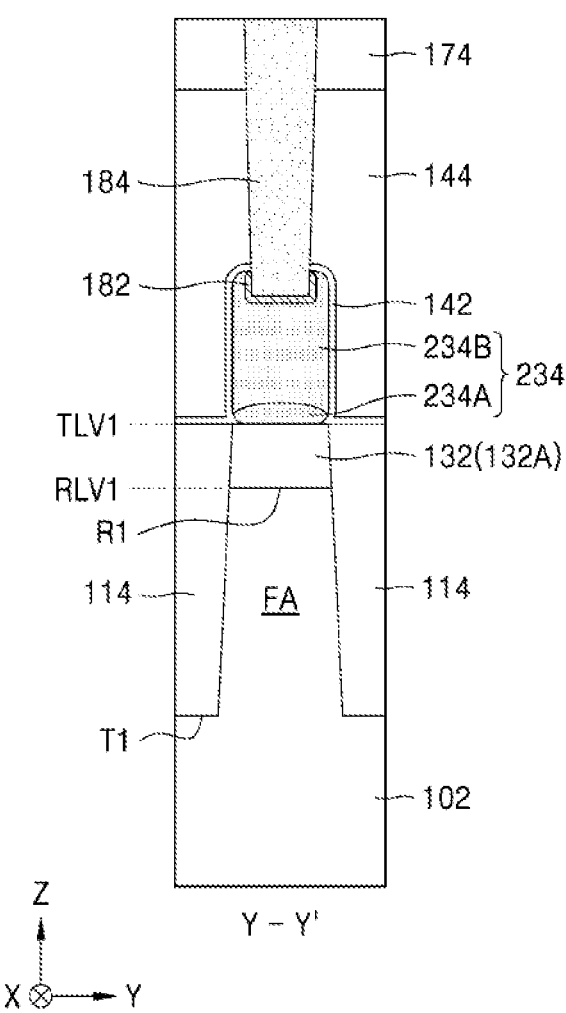

FIGS. 3A and 3B are cross-sectional views of an integrated circuit device 200 according to an exemplary embodiment of the present inventive concept, in which FIG. 3A is an enlarged cross-sectional view of a region corresponding to a local region indicated by "X1" in FIG. 2A, and FIG. 3B is a cross-sectional view of a portion corresponding to a cross-section taken along line Y-Y' of FIG. 1.

Referring to FIGS. 3A and 3B, the integrated circuit device 200 may have a configuration substantially the same as that of the integrated circuit device 100 described with reference to FIGS. 1, 2A, and 2B. However, the integrated circuit device 200 may include a source/drain region 234 including a first semiconductor layer 234A and a second semiconductor layer 234B, which have different dopant concentrations from each other.

The first semiconductor layer 234A may contact the anti-punch-through semiconductor layer 132, and the second semiconductor layer 234B may be apart from the anti-punch-through semiconductor layer 132 with the first semiconductor layer 234A interposed therebetween. In an exemplary embodiment of the present inventive concept, each of the first semiconductor layer 234A and the second semiconductor layer 234B may include a Si layer doped with an n-type dopant. In an exemplary embodiment of the present inventive concept, each of the first semiconductor layer 234A and the second semiconductor layer 234B may include a SiGe layer doped with a p-type dopant. A dopant concentration of the second semiconductor layer 234B may be greater than that of the first semiconductor layer 234A. For example, the first semiconductor layer 234A may have a relatively low dopant concentration and may be close to the anti-punch-through semiconductor layer 132, and the second semiconductor layer 234B may have a relatively high dopant concentration and may be far away from the anti-punch-through semiconductor layer 132. A more detailed configuration of the source/drain region 234 may be substantially the same as that described for the source/drain region 134 with reference to FIGS. 2A and 2B.

Figure 4A:
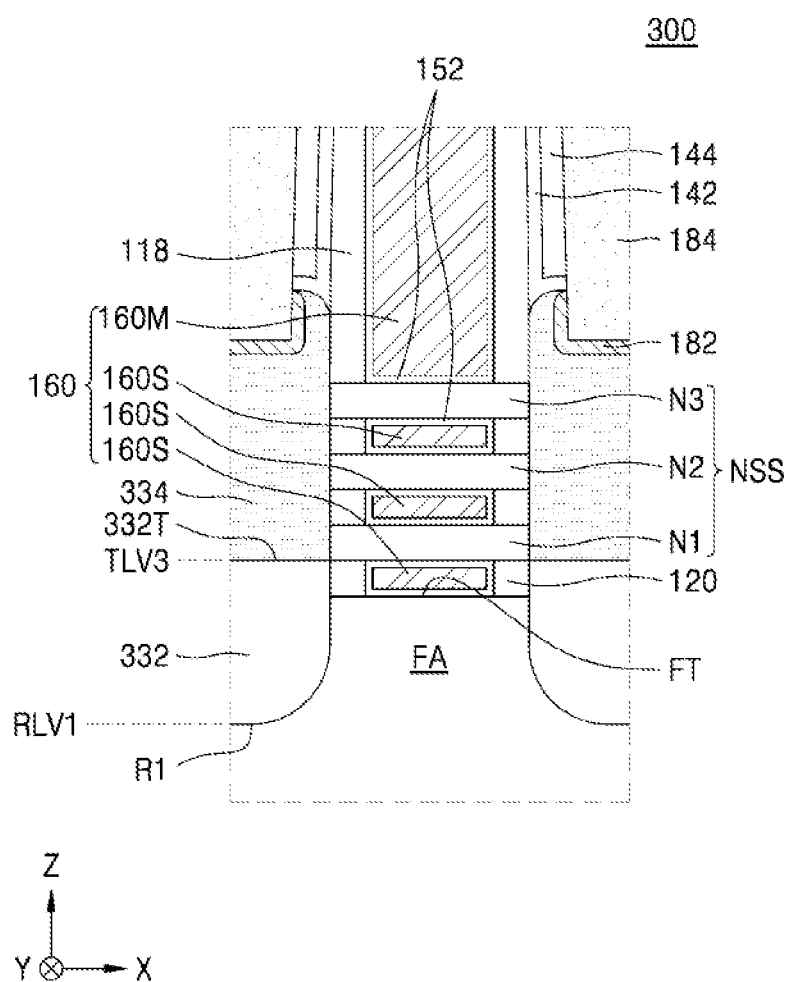
Figure 4B:
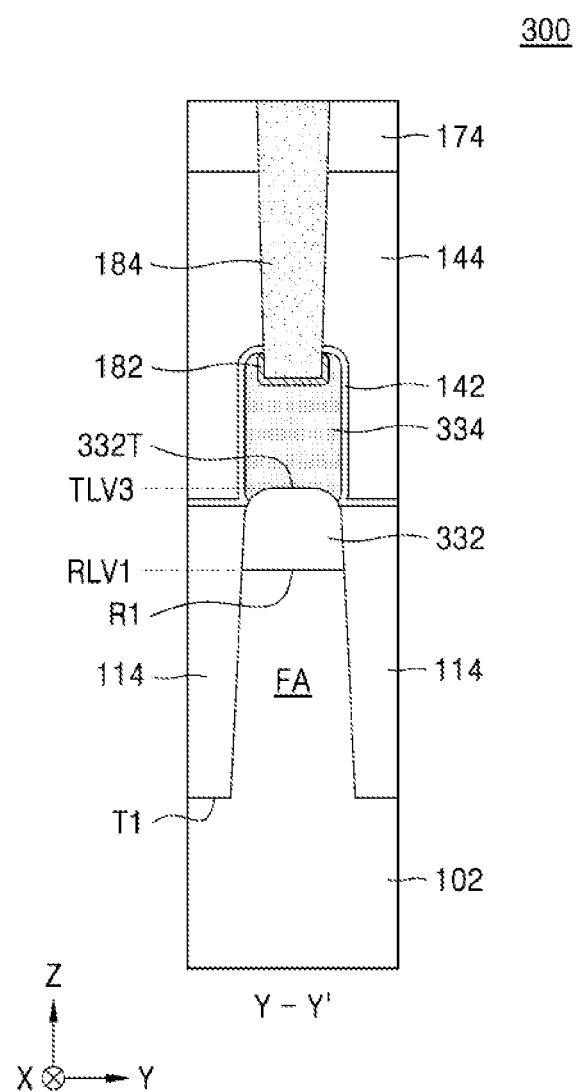

FIGS. 4A and 4B are cross-sectional views of an integrated circuit device 300 according to an exemplary embodiment of the present inventive concept, in which FIG. 4A is an enlarged cross-sectional view of a region corresponding to a local region indicated by "X1" in FIG. 2A, and FIG. 4B is a cross-sectional view of a portion corresponding to a cross-section taken along line Y-Y' of FIG. 1.

Referring to FIGS. 4A and 4B, the integrated circuit device 300 may have a configuration substantially the same as that of the integrated circuit device 100 described with reference to FIGS. 1, 2A, and 2B. However, the integrated circuit device 300 may include a plurality of anti-punch-through semiconductor layers 332 filling the plurality of anti-punch-through recesses R1, and a plurality of source/drain regions 334 formed over the plurality of anti-punch-through semiconductor layers 332.

Each of the plurality of anti-punch-through semiconductor layers 332 may include a portion that is in contact with the side wall of the first nanosheet N1 outside the anti-punch-through recess R1. In an exemplary embodiment of the present inventive concept, each of the plurality of anti-punch-through semiconductor layers 332 may include a portion that is in contact with the sidewall of the second insulation spacer 120 contacting the sub-gate portion 160S, that is closest to the fin top surface FT of the fin-type active area FA among the plurality of sub-gate portions 160S, in which the portion is outside the anti-punch-through recess R1. The anti-punch-through semiconductor layer 332 may be apart from at least one nanosheet including the third nanosheet N3, which is the uppermost nanosheet of the plurality of nanosheets (N1, N2, and N3). In an exemplary embodiment of the present inventive concept, the anti-punch-through semiconductor layer 332 may not contact the second and third nanosheets N2 and N3. In an exemplary embodiment of the present inventive concept, the anti-punch-through semiconductor layer 332 may not contact the first, second and third nanosheets N1, N2 and N3. In FIG. 4A, a top surface 332T of the anti-punch-through semiconductor layer 332 is illustrated as extending flat in the first horizontal direction (X direction), but the present inventive concept is not limited thereto. For example, the top surface 332T of the anti-punch-through semiconductor layer 332 may be curved in the first horizontal direction (X direction).

Each of the plurality of source/drain regions 334 may be in contact with at least one nanosheet including the third nanosheet N3 that is the uppermost nanosheet among the plurality of nanosheets (N1, N2, and N3). As illustrated in FIG. 4A, each of the plurality of source/drain regions 334 may contact the first, second and third nanosheets N1, N2 and N3. In an exemplary embodiment of the present inventive concept, the plurality of source/drain regions 334 may include a plurality of semiconductor layers having different dopant concentrations from each other, similar to the source/drain regions 234 described with reference to FIGS. 3A and 3B. For example, in each of the plurality of source/drain regions 334, a dopant concentration of a portion far from the anti-punch-through semiconductor layer 332 may be higher that a dopant concentration of a portion close to the anti-punch-through semiconductor layer 332.

The top surface 332T of each of the plurality of anti-punch-through semiconductor layers 332 may be in contact with the source/drain region 334. A level of a portion vertically overlapping a lowermost portion of the inner wall of the anti-punch-through recess R1 at a lowermost level on the top surface 332T of the anti-punch-through semiconductor layer 332 may be higher than the level of the fin top surface FT of the fin-type active area FA. At least a portion of a level TLV3 of the top surface 332T of the anti-punch-through semiconductor layer 332 may be higher than the level of the top surface of the isolation layer 114. In an exemplary embodiment of the present inventive concept, the level TLV3 of the top surface 332T of the anti-punch-through semiconductor layer 332 may be higher than a bottom surface level of the first nanosheet N1 and lower than a bottom surface level of the second nanosheet N2. In an exemplary embodiment of the present inventive concept, the level TLV3 of the top surface 332T of the anti-punch-through semiconductor layer 332 may be equal to or lower than the bottom surface level of the first nanosheet N1. A level of the interface between the anti-punch-through semiconductor layer 332 and the source/drain region 334 may be higher than the level of the fin top surface FT of the fin-type active area FA.

A more detailed configuration of the plurality of anti-punch-through semiconductor layers 332 and the plurality of source/drain regions 334 is substantially the same as that of the plurality of anti-punch-through semiconductor layers 132 and the plurality of source/drain regions 134 described with reference to FIGS. 2A and 2B.

Figure 5:
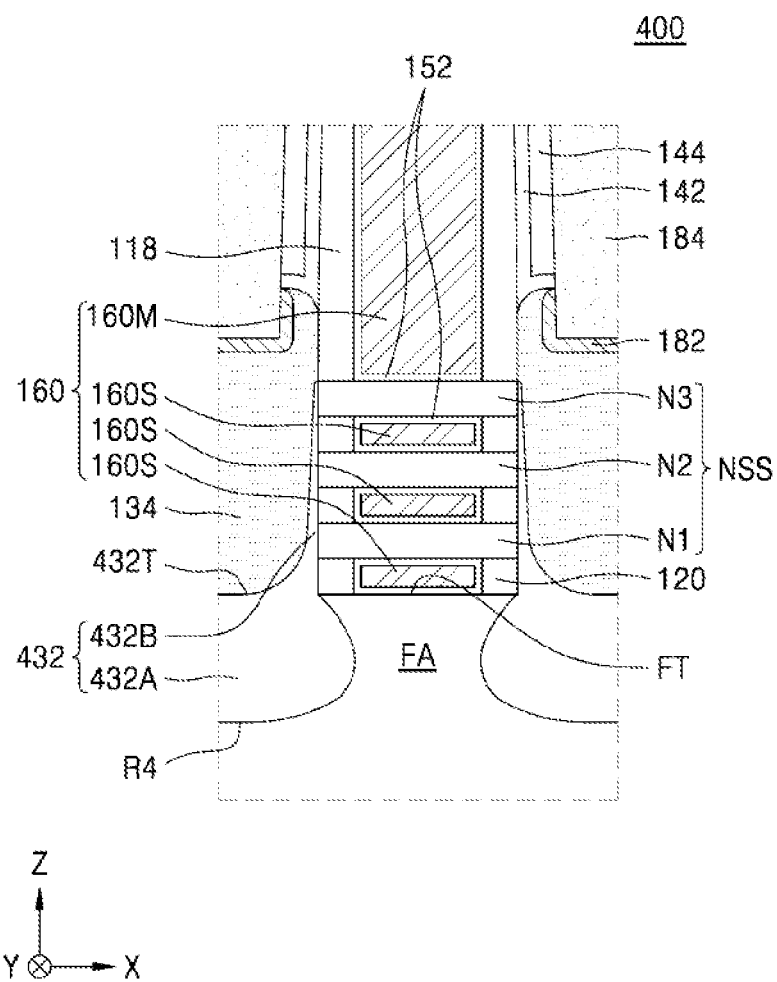
FIG. 5 is a cross-sectional view of an integrated circuit device according to an exemplary embodiment of the present inventive concept.

FIG. 5 is a cross-sectional view of an integrated circuit device 400 according to an exemplary embodiment of the present inventive concept, and is an enlarged cross-sectional view of an area corresponding to the local area indicated by "X1" in FIG. 2A.

Referring to FIG. 5, the integrated circuit device 400 may have a configuration substantially the same as that of the integrated circuit device 100 described with reference to FIGS. 1, 2A, and 2B. However, the integrated circuit device 400 may include a plurality of anti-punch-through recesses R4 formed in the fin-type active region FA, and a plurality of anti-punch-through semiconductor layers 432 filling the plurality of anti-punch-through recesses R4. The plurality of anti-punch-through recesses R4 may extend to the bottom portion of the nanosheet stacks NSS in the fin-type active area FA. Each of the plurality of anti-punch-through semiconductor layers 432 may include a first portion 432A filling the anti-punch-through recess R4, and a second portion 432B covering the side walls of at least some of the plurality of nanosheets (N1, N2, and N3). The second portion 432B may be outside the anti-punch-through recess R4. The first portion 432A of the plurality of anti-punch-through semiconductor layers 432 may include portions that vertically overlap the nanosheet stacks NSS. A more detailed configuration of the plurality of anti-punch-through semiconductor layers 432 is substantially the same as that of the plurality of anti-punch-through semiconductor layers 132 described with reference to FIGS. 2A and 2B.

In an exemplary embodiment of the present inventive concept, the plurality of source/drain regions 134 may include a plurality of semiconductor layers having different dopant concentrations from each other, similar to the source/drain regions 234 described with reference to FIGS. 3A and 3B. For example, in each of the plurality of source/drain regions 134, a dopant concentration of a portion far from the anti-punch-through semiconductor layer 432 may be higher that a dopant concentration of a portion close to the anti-punch-through semiconductor layer 432.

In the integrated circuit device 400 illustrated in FIG. 5, due to portions of the plurality of anti-punch-through semiconductor layers 432 vertically overlapping the nanosheet stacks NSS, a length of the anti-punch-through semiconductor layer 432 arranged between the fin-type active area FA and the source/drain region 134 may increase, and accordingly, a distance between the fin-type active area FA and the source/drain region 134 may further increase, compared with the case of the integrated circuit device 100 illustrated in FIGS. 2A and 2B, and thus, a punch-through via the fin-type active area FA may be more effectively blocked in the bottom portion of the nanosheet stack NSS. In addition, when the source/drain region 134 comprises a semiconductor layer doped with a first dopant of a first conductivity type, and the anti-punch-through semiconductor layer 432, which has a portion vertically overlapping the nanosheet stack NSS in the fin-type active region FA, is doped with a second dopant of a second conductivity type that is opposite to the first conductivity type, deterioration of electrical characteristics due to short channel effects (SCE) may be suppressed.

Figure 6:
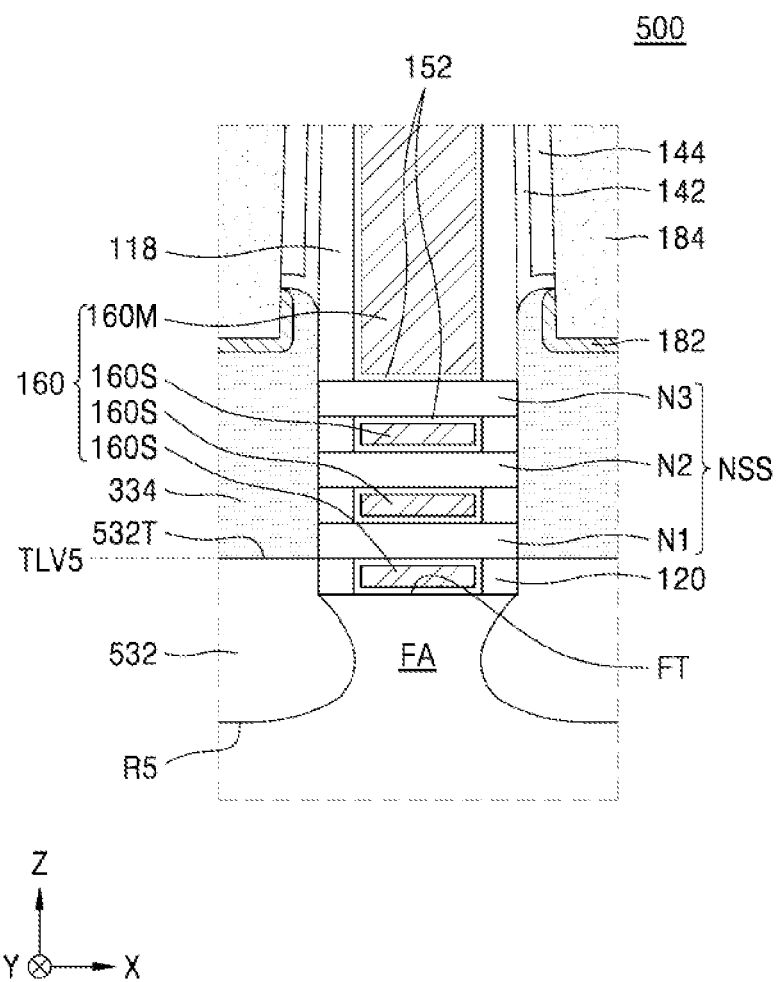
FIG. 6 is a cross-sectional view of an integrated circuit device according to an exemplary embodiment of the present inventive concept.

FIG. 6 is a cross-sectional view of an integrated circuit device 500 according to an exemplary embodiment of the present inventive concept, and is an enlarged cross-sectional view of an area corresponding to the local area indicated by "X1" in FIG. 2A.

Referring to FIG. 6, the integrated circuit device 500 may have a configuration substantially the same as that of the integrated circuit device 300 described with reference to FIGS. 4A and 4B. However, the integrated circuit device 500 may include a plurality of anti-punch-through recesses R5 formed in the fin-type active region FA, and a plurality of anti-punch-through semiconductor layers 532 filling the plurality of anti-punch-through recesses R5. The plurality of anti-punch-through recesses R5 may extend to the bottom portion of the nanosheet stacks NSS in the fin-type active area FA. Portions filling the plurality of anti-punch-through recesses R5 of the plurality of anti-punch-through semiconductor layers 532 may include portions vertically overlapping the nanosheet stacks NSS.

Each of the plurality of anti-punch-through semiconductor layers 532 may include a portion contacting the side wall of the first nanosheet N1 outside the anti-punch-through recess R5. In an exemplary embodiment of the present inventive concept, each of the plurality of anti-punch-through semiconductor layers 532 may include a portion that is in contact with the sidewall of the second insulation spacer 120 contacting the sub-gate portion 160S, that is closest to the fin top surface FT of the fin-type active area FA among the plurality of sub-gate portions 160S, in which the portion is outside the anti-punch-through recess R5. The anti-punch-through semiconductor layer 532 may be apart from at least one nanosheet including the third nanosheet N3, which is the uppermost nanosheet of the plurality of nanosheets (N1, N2, and N3). In an exemplary embodiment of the present inventive concept, the anti-punch-through semiconductor layer 532 may not contact the second and third nanosheets N2 and N3. In an exemplary embodiment of the present inventive concept, the anti-punch-through semiconductor layer 532 may not contact the first, second and third nanosheets N1, N2 and N3.

The top surface 532T of the plurality of anti-punch-through semiconductor layers 532 may be in contact with the source/drain regions 334. At least a portion of the top surface 532T of the anti-punch-through semiconductor layer 532 may have a level higher than a level of the fin top surface FT of the fin-type active area FA. In an exemplary embodiment of the present inventive concept, a level TLV5 of the top surface 532T of the anti-punch-through semiconductor layer 532 may be higher than the level of the bottom surface of the first nanosheet N1 and may be lower than the level of the bottom surface of the second nanosheet N2. In an exemplary embodiment of the present inventive concept, the level TLV5 of the top surface 532T of the anti-punch-through semiconductor layer 532 may be equal to or lower than the level of the bottom surface of the first nanosheet N1. A more detailed configuration for the anti-punch-through semiconductor layer 532 may be substantially the same as that of the plurality of anti-punch-through semiconductor layers 132 described with reference to FIGS. 2A and 2B.

Figure 7:
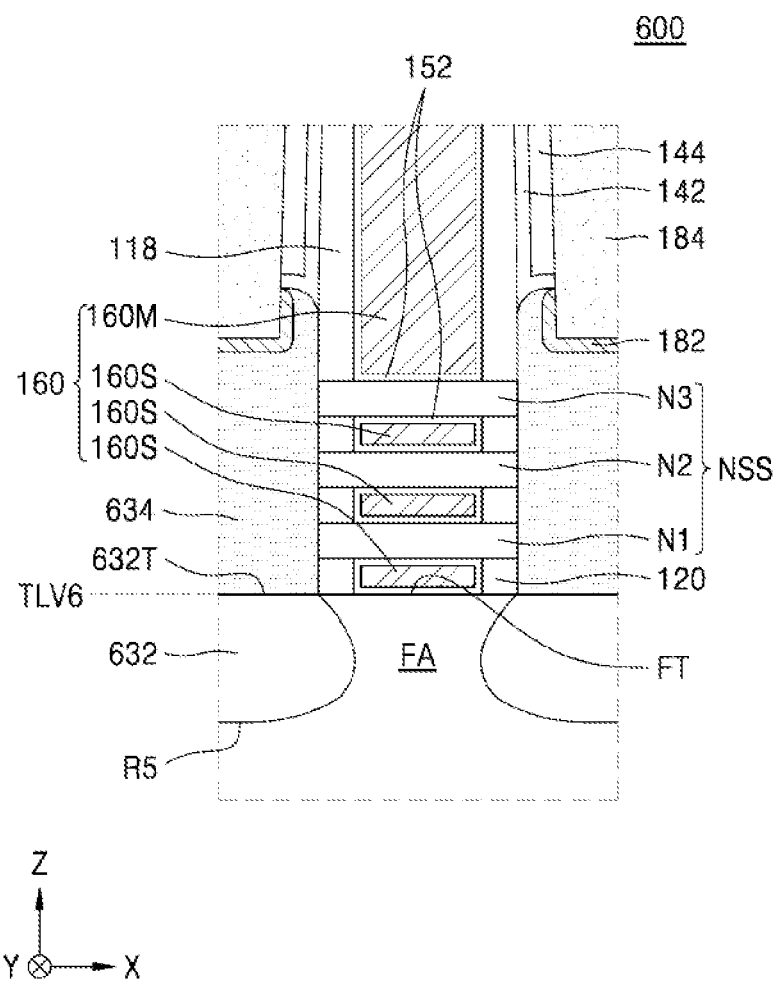
FIG. 7 is a cross-sectional view of an integrated circuit device according to an exemplary embodiment of the present inventive concept.

FIG. 7 is a cross-sectional view of an integrated circuit device 600 according to an exemplary embodiment of the present inventive concept, and is an enlarged cross-sectional view of an area corresponding to the local area indicated by "X1" in FIG. 2A.

Referring to FIG. 7, the integrated circuit device 600 may have a configuration substantially the same as that of the integrated circuit device 500 described with reference to FIG. 6. However, the integrated circuit device 600 may include a plurality of anti-punch-through semiconductor layers 632 filling the plurality of anti-punch-through recesses R5, and a plurality of source/drain regions 634 formed on the plurality of anti-punch-through semiconductor layers 632.

Portions filling the plurality of anti-punch-through recesses R5 of the plurality of anti-punch-through semiconductor layers 632 may include portions vertically overlapping the nanosheet stacks NSS. The plurality of anti-punch-through semiconductor layers 632 may not contact the sidewalls of the plurality of nanosheets (N1, N2, and N3) included in the nanosheet stacks NSS, respectively. In an exemplary embodiment of the present inventive concept, each of the plurality of anti-punch-through semiconductor layers 632 may not be in contact with the sidewall of the second insulation spacer 120 contacting the sub-gate portion 160S, that is closest to the fin top surface FT of the fin-type active area FA among the plurality of sub-gate portions 160S, outside the anti-punch-through recess R1.

The plurality of source/drain regions 634 may be in contact with the plurality of nanosheets (N1, N2, and N3) included in the nanosheet stacks NSS, respectively. In an exemplary embodiment of the present inventive concept, the plurality of source/drain regions 634 may include a plurality of semiconductor layers having different dopant concentrations, similar to the source/drain regions 234 described with reference to FIGS. 3A and 3B. For example, in each of the plurality of source/drain regions 634, a dopant concentration of a portion far from the anti-punch-through semiconductor layer 632 may be higher that a dopant concentration of a portion close to the anti-punch-through semiconductor layer 632.

A top surface 632T of the anti-punch-through semiconductor layer 632 may be in contact with the source/drain region 634. A level of a portion vertically overlapping a lowermost portion of an inner wall of the anti-punch-through recess R5 on the top surface 632T of the anti-punch-through semiconductor layer 632 may be equal to or lower than the level of the fin top surface FT of the fin-type active area FA. In FIG. 7, the top surface 632T of the anti-punch-through semiconductor layer 632 is illustrated as extending flat in the first horizontal direction (X direction), but the present inventive concept is not limited thereto. For example, the top surface 632T of the anti-punch-through semiconductor layer 632 may be curved in the first horizontal direction (X direction).

A more detailed configuration for the plurality of anti-punch-through semiconductor layers 632 and the plurality of source/drain regions 634 may be substantially the same as that of the plurality of anti-punch-through semiconductor layers 132 and the plurality of source/drain regions 134 described with reference to FIGS. 2A and 2B.

Figure 8:
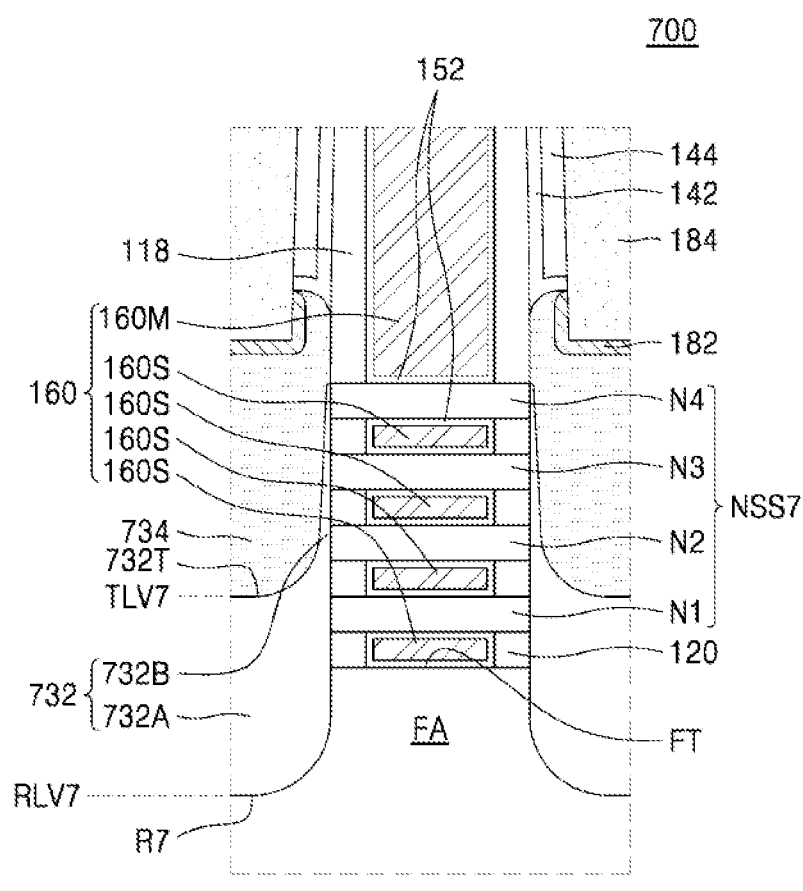
FIG. 8 is a cross-sectional view of an integrated circuit device according to an exemplary embodiment of the present inventive concept.

FIG. 8 is a cross-sectional view of an integrated circuit device 700 according to an exemplary embodiment of the present inventive concept, and is an enlarged cross-sectional view of an area corresponding to the local area indicated by "X1" in FIG. 2A.

Referring to FIG. 8, the integrated circuit device 700 may have a configuration substantially the same as that of the integrated circuit device 100 described with reference to FIGS. 1, 2A, and 2B. However, the integrated circuit device 700 may include a nanosheet stack NSS7 facing the fin top surfaces FT of the plurality of fin-type active areas FA, and the nanosheet stack NSS7 may include the plurality of nanosheets (N1, N2, N3, and N4) which have different distances (Z direction distances) from each other from the fin top surface FT. Each of the plurality of nanosheets (N1, N2, N3 and N4) may include the first nanosheet N1, the second nanosheet N2, the third nanosheet N3, and a fourth nanosheet N4, which are sequentially stacked on the fin top surface FT of the fin-type active area FA. A more detailed configuration for the nanosheet stack NSS7 may be substantially the same as that of the nanosheet stack NSS described with reference to FIGS. 2A and 2B.

The plurality of gate lines 160 may surround the plurality of nanosheets (N1, N2, N3, and N4) while covering the nanosheet stack NSS7 on the fin-type active area FA, respectively. A gate dielectric layer 152 may be formed between the plurality of nanosheets (N1, N2, N3, and N4) and the plurality of gate lines 160. Thus, the plurality of gate structures may surround the plurality of nanosheets (N1, N2, N3, and N4) while covering the nanosheet stack NSS7 on the fin-type active area FA, respectively.

A plurality of anti-punch-through recesses R7 may be formed on the fin top surface FT of the fin-type active area FA. A lowermost level RLV7 of the plurality of anti-punch-through recesses R7 may be lower than the level of the fin top surface FT of the fin-type active area FA.

The integrated circuit device 700 may include a plurality of anti-punch-through semiconductor layers 732 filling the plurality of anti-punch-through recesses R7. Each of the plurality of anti-punch-through semiconductor layers 732 may include a first portion 732A filling the anti-punch-through recess R7, and a second portion 732B extending in a direction away from the first portion 732A and the fin-type active area FA. The first portion 732A may extend upwardly in the vertical direction (Z direction) from the inside of the anti-punch-through recess R7 to the outside of the anti-punch-through recess R7. The second portion 732B may cover at least some of side walls of the plurality of nanosheets (N1, N2, N3, and N4) from the outside of the anti-punch-through recess R7. The plurality of anti-punch-through semiconductor layers 732 may have a non-conformal thickness depending on positions thereof. In each of the plurality of anti-punch-through semiconductor layers 732, a thickness of a portion covering an inner wall of the anti-punch-through recesses R7 may be greater than a thickness of a portion covering side walls of each of the plurality of nanosheets (N1, N2, N3, and N4). The anti-punch-through semiconductor layer 732 between an adjacent pair of nanosheet stacks NSS7 may include two second portions 732B that are integrally connected to the first portion 732A, and may have a U-shape on a cross-section in a horizontal direction (for example, the first horizontal direction, i.e., the X direction).

On top surfaces 732T of the plurality of anti-punch-through semiconductor layers 732, a level TLV7 of a portion that vertically overlaps a lowermost portion at a lowermost level among the inner walls of the anti-punch-through recess R7 may be higher than a level of the fin top surface FT of the fin-type active area FA. In an exemplary embodiment of the present inventive concept, a lowermost level TLV7 of the top surface 732T of the anti-punch-through semiconductor layer 732 may be higher than the level of the bottom surface of the first nanosheet N1 and may be equal to or lower than the level of the bottom surface of the second nanosheet N2.

The second portion 732B of each of the plurality of anti-punch-through semiconductor layers 732 may cover the side walls of at least some of other nanosheets (N3 and N4) which are the plurality of nanosheets (N1, N2, N3, and N4) except the first and second nanosheets N1 and N2, which are most adjacent to the fin-type active area FA, to a thickness of about 2 nm or less, for example, to a thickness of about 1 nm or less. When the anti-punch-through semiconductor layer 732 covers the side walls of at least some of the nanosheets (e.g., N3 and N4) to a thickness of about 2 nm or less, the influence on electrical characteristics of the transistors including the at least some of the nanosheets (e.g., N3 and N4) may be reduced. For example, the transistors including the third and fourth nanosheets N3 and N4 and having gate-all-around (GAA) structures may maintain good electrical characteristics, when the second portion 732B covers the sidewall of the third and fourth nanosheets N3 and N4 to a thickness of about 2 nm or less. The second portion 732B of each of the plurality of anti-punch-through semiconductor layers 732 may cover the sidewalls of the first and second nanosheets N1 and N2 to a thickness of about 2 nm or greater. The thickness of the second portion 732B of each of the plurality of anti-punch-through semiconductor layers 732 may gradually increase toward the first portion 732A.

A plurality of source/drain regions 734 may be formed on the plurality of anti-punch-through semiconductor layers 732. The plurality of source/drain regions 734 may respectively contact the anti-punch-through semiconductor layers 732. A level, for example, a lowermost level of an interface between the anti-punch-through semiconductor layer 732 and the source/drain region 734 may be equal to or lower than the level of the bottom surface of the second nanosheet N2. In an exemplary embodiment of the present inventive concept, the plurality of source/drain regions 734 may include a plurality of semiconductor layers having different dopant concentrations from each other, similar to the source/drain regions 234 described with reference to FIGS. 3A and 3B. For example, in each of the plurality of source/drain regions 734, a dopant concentration of a portion far from the anti-punch-through semiconductor layer 732 may be higher that a dopant concentration of a portion close to the anti-punch-through semiconductor layer 732.

A more detailed configuration for the plurality of anti-punch-through semiconductor layers 732 and the plurality of source/drain regions 734, and the nanosheet stacks NSS7 may be substantially the same as that of the plurality of anti-punch-through semiconductor layers 132 and the plurality of source/drain regions 134, and the nanosheet stacks NSS7 described with reference to FIGS. 2A and 2B.

Because the integrated circuit device 700 includes the anti-punch-through semiconductor layer 732 between the fin-type active area FA and the source/drain region 734, channels may be formed in the vicinities of top surfaces and bottom surfaces of the second through fourth nanosheets N2 through N4 of the plurality of nanosheets (N1, N2, N3, and N4), respectively, but channels may not be formed in the vicinity of the bottom surface of the first nanosheet N1 facing the fin-type active area FA due to the anti-punch-through semiconductor layer 732. Accordingly, an undesired parasitic transistor may not be formed near the fin top surface FT of the fin-type active area FA, and thus, electrical characteristics deterioration such as an increase in parasitic capacitance, an increase in leakage current, and an increase in subthreshold swing, which are caused by the parasitic transistor, may be prevented.

Figure 9:
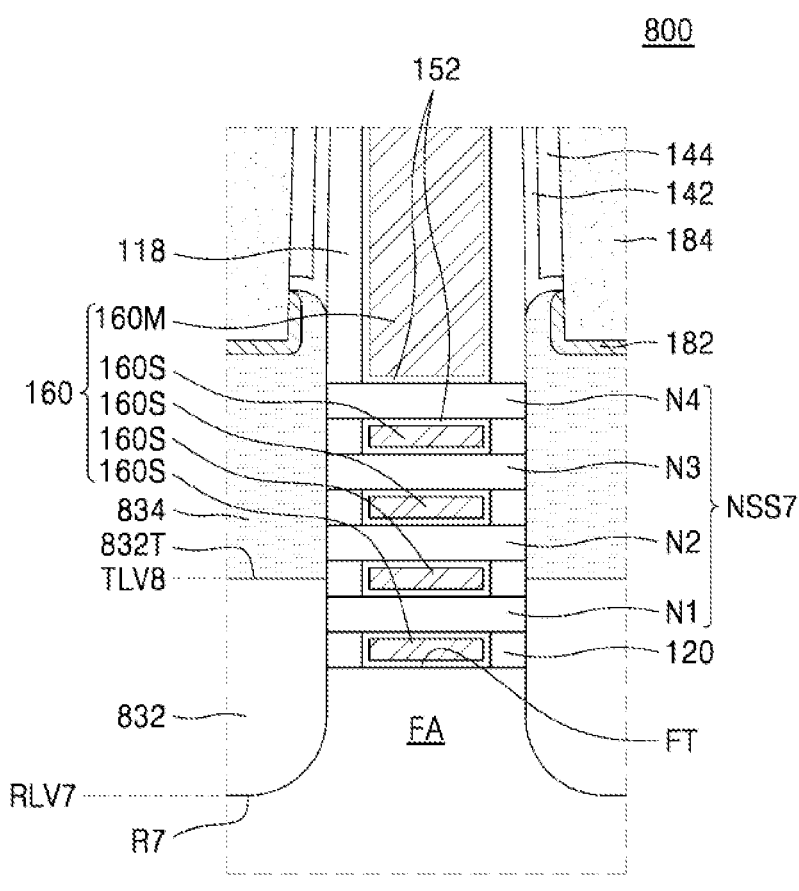
FIG. 9 is a cross-sectional view of an integrated circuit device according to an exemplary embodiment of the present inventive concept.

FIG. 9 is a cross-sectional view of an integrated circuit device 800 according to an exemplary embodiment of the present inventive concept, and is an enlarged cross-sectional view of an area corresponding to the local area indicated by "X1" in FIG. 2A.

Referring to FIG. 9, the integrated circuit device 800 may have a configuration substantially the same as that of the integrated circuit device 700 described with reference to FIG. 8. However, the integrated circuit device 800 may include a plurality of anti-punch-through semiconductor layers 832 filling the plurality of anti-punch-through recesses R7, and a plurality of source/drain regions 834 formed on the plurality of anti-punch-through semiconductor layers 832.

Each of the plurality of anti-punch-through semiconductor layers 832 may have a portion contacting the side walls of the first and second nanosheets N1 and N2 included in the nanosheet stack NSS7 outside the anti-punch-through recess R7. In an exemplary embodiment of the present inventive concept, each of the plurality of anti-punch-through semiconductor layers 832 may have a portion contacting the side wall of the first nanosheet N1 included in the nanosheet stack NSS7 outside the anti-punch-through recess R7 as shown in FIG. 9. The anti-punch-through semiconductor layer 832 may be apart from at least one nanosheet including the fourth nanosheet N4, which is the uppermost nanosheet of the plurality of nanosheets (N1, N2, N3, and N4). In an exemplary embodiment of the present inventive concept, the anti-punch-through semiconductor layer 832 may not contact the third and fourth nanosheets N3 and N4. In an exemplary embodiment of the present inventive concept, the anti-punch-through semiconductor layer 832 may not contact the second, third and fourth nanosheets N2, N3 and N4.

Each of the plurality of source/drain regions 834 may be in contact with at least one nanosheet including the fourth nanosheet N4 that is the uppermost nanosheet among the plurality of nanosheets (N1, N2, N3, and N4). The plurality of source/drain regions 834 may include a plurality of semiconductor layers having different dopant concentrations from each other, similar to the source/drain regions 234 described with reference to FIGS. 3A and 3B. For example, in each of the plurality of source/drain regions 834, a dopant concentration of a portion far from the anti-punch-through semiconductor layer 832 may be higher that a dopant concentration of a portion close to the anti-punch-through semiconductor layer 832.

Each of the plurality of anti-punch-through semiconductor layers 832 may have a top surface 832T extending relatively flat in the first horizontal direction (X direction). However, the present inventive concept is not limited thereto. For example, the top surface 832T of the anti-punch-through semiconductor layer 832 may be curved in the first horizontal direction (X direction). The top surface 832T of the anti-punch-through semiconductor layer 832 may be in contact with the source/drain region 834. A level TLV8 of a portion vertically overlapping the lowermost portion at the lowermost level among the inner walls of the anti-punch-through recesses R7 on the top surface 832T of the anti-punch-through semiconductor layer 832 may be higher than the level of the top surface of the first nanosheet N1 and may be lower than the bottom level of the second nanosheet N2.

A more detailed configuration for the plurality of anti-punch-through semiconductor layers 832 and the plurality of source/drain regions 834 may be substantially the same as that of the plurality of anti-punch-through semiconductor layers 132 and the plurality of source/drain regions 134 described with reference to FIGS. 2A and 2B.

Figure 10A:
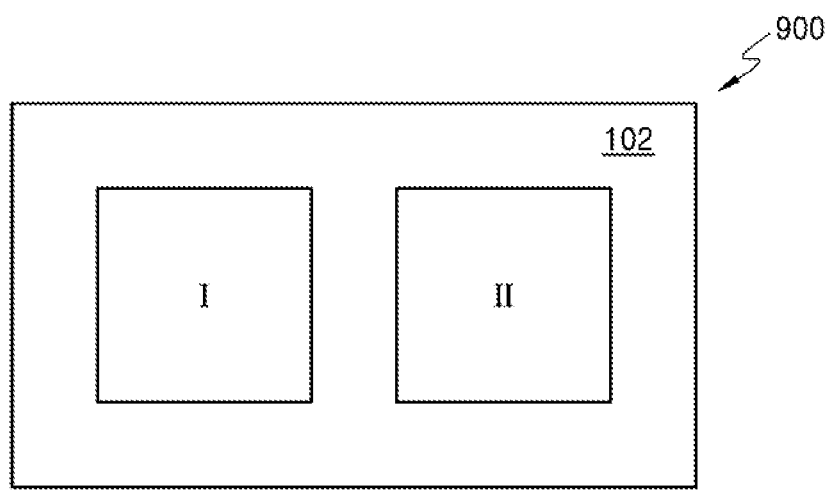
FIG. 10A is a block diagram of an integrated circuit device according to an exemplary embodiment of the present inventive concept.

FIG. 10A is a block diagram of an integrated circuit device 900 according to an exemplary embodiment of the present inventive concept.

Referring to FIG. 10A, the integrated circuit device 900 may include the substrate 102 having a first region I and a second region II.

The first region I and the second region II may be different regions of the substrate 102. The first region I and the second region II may be regions that perform different functions on the substrate 102. The first region I and the second region II may be apart from each other or may be adjacent to each other. The first region I and the second region II may be regions where different threshold voltages are required. For example, the first region I and the second region II may be different regions selected from the NMOS transistor region and the PMOS transistor region. Each of the first region I and the second region II may include any one configuration among configurations described for the integrated circuit devices (100, 200, 300, 400, 500, 600, 700, and 800) which have been described with reference to FIGS. 1 through 9, respectively.

Figure 10B:
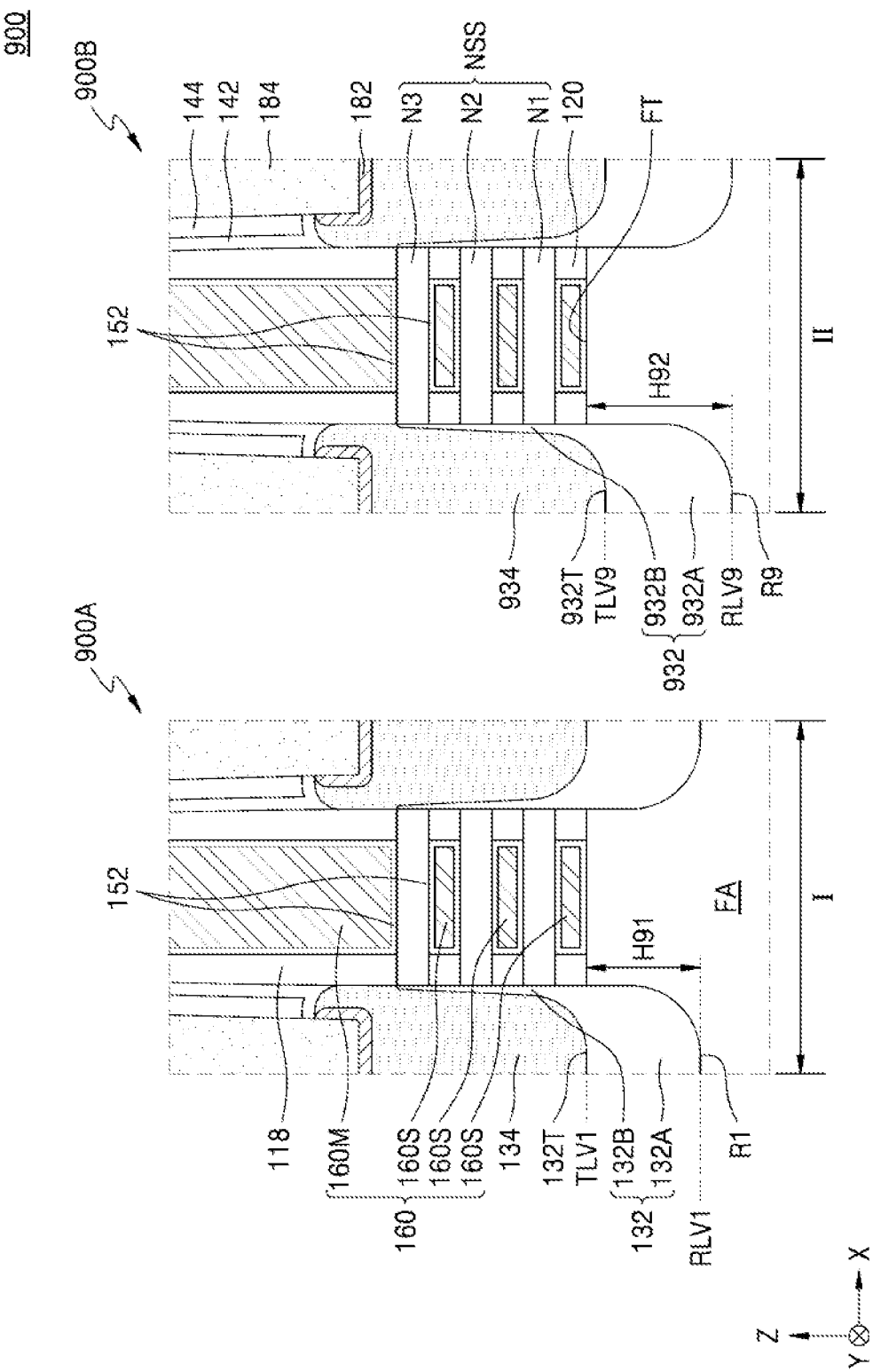
FIG. 10B illustrates example cross-sectional structures of local regions of a first region and a second region that are included in the integrated circuit device illustrated in FIG. 10A.

FIG. 10B illustrates cross-sectional views illustrating local cross-sectional configurations of the first region I and the second region II included in the integrated circuit device 900 illustrated in FIG. 10A, respectively.

Referring to FIG. 10B, a first integrated circuit device unit 900A may be included in the first region I of the substrate 102, and a second integrated circuit device unit 900B may be included in the second region II of the substrate 102. Each cross-sectional view of the first integrated circuit device unit 900A and the second integrated circuit device unit 900B is an enlarged cross-sectional view of an area corresponding to the local area indicated by "X1" in FIG. 2A.

The first integrated circuit device unit 900A may have a configuration the same as that described for the integrated circuit device 100 illustrated in FIGS. 2A and 2B.

The second integrated circuit device unit 900B in the second region II may have a configuration substantially the same as that described for the integrated circuit device 100 illustrated in FIGS. 2A and 2B, except for including a plurality of anti-punch-through recesses R9 and a plurality of anti-punch-through semiconductor layers 932 filling the plurality of anti-punch-through recesses R9.

In the second integrated circuit device unit 900B in the second region II, a lowermost level RLV9 of the plurality of anti-punch-through recesses R9 may be different from the lowermost level RLV1 of the plurality of anti-punch-through recesses R1 in the first region I. For example, as illustrated in FIG. 10B, the lowermost level RLV9 of the plurality of anti-punch-through recesses R9 may be lower than the lowermost level RLV1 of the plurality of anti-punch-through recesses R1.

A top surface 932T of a plurality of anti-punch-through semiconductor layers 932 in the second region II may be at the lowermost level TLV9 at portions that vertically overlap the lowermost portions of the plurality of the anti-punch-through recesses R9, respectively. The lowermost level TLV9 of the top surface 932T of the plurality of anti-punch-through semiconductor layers 932 may be different from the lowermost level TLV1 of the top surface 132T of the plurality of anti-punch-through semiconductor layers 132 in the first region I. The lowermost level TLV1 of the top surface 132T of the plurality of anti-punch-through semiconductor layers 132 may be equal to or lower than the level of the fin top surface FT of the fin-type active area FA. For example, as illustrated in FIG. 10B, the lowermost level TLV9 of the top surface 932T of the plurality of anti-punch-through semiconductor layers 932 may be lower than the lowermost level TLV1 of the top surface 132T of the plurality of anti-punch-through semiconductor layers 132. The lowermost level TLV9 of the top surface 932T of the plurality of anti-punch-through semiconductor layers 932 may be lower than the level of the fin top surface FT of the fin-type active area FA.

A height H92 of a portion limited by two anti-punch-through semiconductor layers 932 on both sides of the nanosheet stack NSS on the bottom of the nanosheet stack NSS in the fin-type active area FA in the second region II may be greater than a height H91 of a portion limited by two anti-punch-through semiconductor layers 132 on both sides of the nanosheet stack NSS on the bottom of the nanosheet stack in the fin-type active area FA of the first region I. The height H92 may be the vertical distance (distance in the Z direction) between the lowermost level RLV9 of the plurality of anti-punch-through recesses R9 and the level of the fin top surface FT of the fin-type active area FA. The height H91 may be the vertical distance (distance in the Z direction) between the lowermost level RLV1 of the plurality of anti-punch-through recesses R1 and the level of the fin top surface FT of the fin-type active area FA. In an exemplary embodiment of the present inventive concept, the first region I may be an NMOS transistor region, and the second region II may be a PMOS transistor region.

Each of the plurality of anti-punch-through semiconductor layers 932 may include a first portion 932A filling the anti-punch-through recess R9, and a second portion 932B covering the side walls of at least some of the plurality of nanosheets (N1, N2, and N3). At least some of the second portion 932B may be outside the anti-punch-through recess R9.

In the second region II, a plurality of source/drain regions 934 may be on the plurality of anti-punch-through semiconductor layers 932. The top surface 932T of the plurality of anti-punch-through semiconductor layers 932 may be respectively in contact with the source/drain regions 934. A level of an interface between the anti-punch-through semiconductor layer 932 and the source/drain region 934 may be lower than the level of the fin top surface FT of the fin-type active area FA. A lowermost level of an interface between the anti-punch-through semiconductor layer 932 and the source/drain region 934 in the second region II may be lower than the lowermost level of the interface between the anti-punch-through semiconductor layer 132 and the source/drain region 134 in the first region I. The lowermost level of the interface between the anti-punch-through semiconductor layer 132 and the source/drain region 134 may be the same as the level TLV1 of the top surfaces 132T of the plurality of anti-punch-through semiconductor layers 132 described above. The lowermost level of the interface between the anti-punch-through semiconductor layer 932 and the source/drain region 934 may be the same as the level TLV9 of the top surfaces 932T of the plurality of anti-punch-through semiconductor layers 932. Thus, the lowermost level TLV9 of the top surface 932T of the plurality of anti-punch-through semiconductor layers 932 in the second region II may be lower than the lowermost level TLV1 of the top surface 132T of the plurality of anti-punch-through semiconductor layers 132 in the first region I.

In an exemplary embodiment of the present inventive concept, a size of each of the plurality of source/drain regions 934 in the second region II may be greater than the size of each of the plurality of source/drain regions 134 in the first region I. Accordingly, the stress applied to the plurality of channel regions formed in the plurality of nanosheets (N1, N2, and N3) by the plurality of source/drain regions 934 in the second region II may be greater than the stress applied to the plurality of channel regions formed in the plurality of nanosheets (N1, N2, and N3) in the first region I, and thus a carrier mobility in the channel regions formed in the plurality of nanosheets (N1, N2, and N3) in the second region II may be enhanced.

In an exemplary embodiment of the present inventive concept, the plurality of source/drain regions 934 may include a plurality of semiconductor layers having different dopant concentrations from each other, similar to the source/drain regions 234 described with reference to FIGS. 3A and 3B. For example, in each of the plurality of source/drain regions 934, a dopant concentration of a portion far from the anti-punch-through semiconductor layer 932 may be higher that a dopant concentration of a portion close to the anti-punch-through semiconductor layer 932.

FIGS. 11 through 27B are cross-sectional views illustrating a method of manufacturing an integrated circuit device 100 according to process sequences, each according to an exemplary embodiment of the present inventive concept, respectively. An example method of manufacturing the integrated circuit device 100 illustrated in FIGS. 2A and 2B is described with reference to FIGS. 11 through 27B. In FIGS. 11 through 27B, FIGS. 11 through 15, 16A, 17, 18, 19A, 20A, 21 through 26, and 27A are cross-sectional views according to a process sequence of the portion corresponding to the cross-section taken along line X-X' in FIG. 1, respectively, and FIGS. 16B, 19B, 20B, and 27B are cross-sectional views according to a process sequence of the portion corresponding to the cross-section taken along line Y-Y' in FIG. 1, respectively. In FIGS. 11 through 27B, the same reference numerals as those in FIG. 1 denote the same members, and a detailed description thereof is omitted here.

Figure 11:
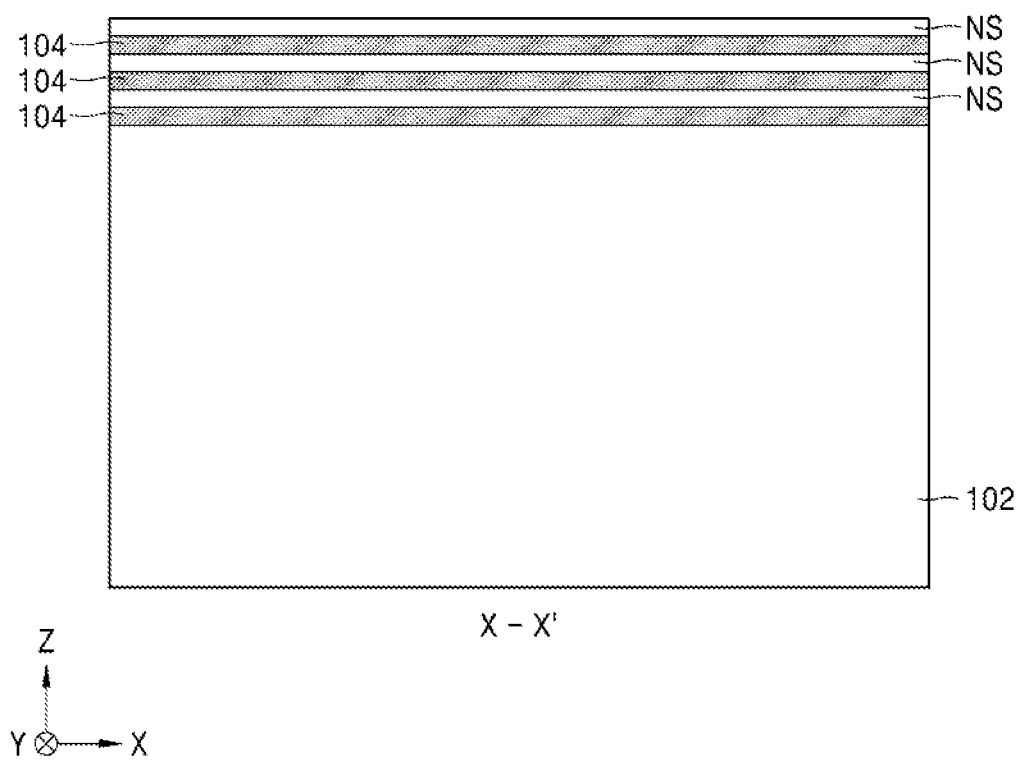
FIGS. 11 to 15, 16A, 16B, 17 to 18, 19A, 19B, 20A, 20B, 21 to 26, 27A and 27B are cross-sectional views for illustrating a method of manufacturing an integrated circuit device according to process sequences, each according to an exemplary embodiment of the present inventive concept.

Referring to FIG. 11, a plurality of sacrificial semiconductor layers 104 and a plurality of nanosheet semiconductor layers NS may be alternately stacked on the substrate 102. In FIG. 11, three sacrificial semiconductor layers 104 and three nanosheet semiconductor layers NS are shown to be formed on the substrate 102, however, the present inventive concept may not be limited thereto. In general, more than one sacrificial semiconductor layer 104 and more than one nanosheet semiconductor layer NS may be required for forming the horizontal nanosheet field-effect transistor (hNSFET). For example, two or more sacrificial semiconductor layers 104 and two or more nanosheet semiconductor layers NS may be formed on the substrate 102 for forming the hNSFET.

The plurality of sacrificial semiconductor layers 104 and the plurality of nanosheet semiconductor layers NS may include different semiconductor materials from each other. The sacrificial semiconductor layers 104 may include a material having an etching selectivity with respect to the substrate 102 and the nanosheet semiconductor layers NS. In an exemplary embodiment of the present inventive concept, the plurality of sacrificial semiconductor layers 104 may include SiGe, and the plurality of nanosheet semiconductor layers NS may include Si.

Figure 12:
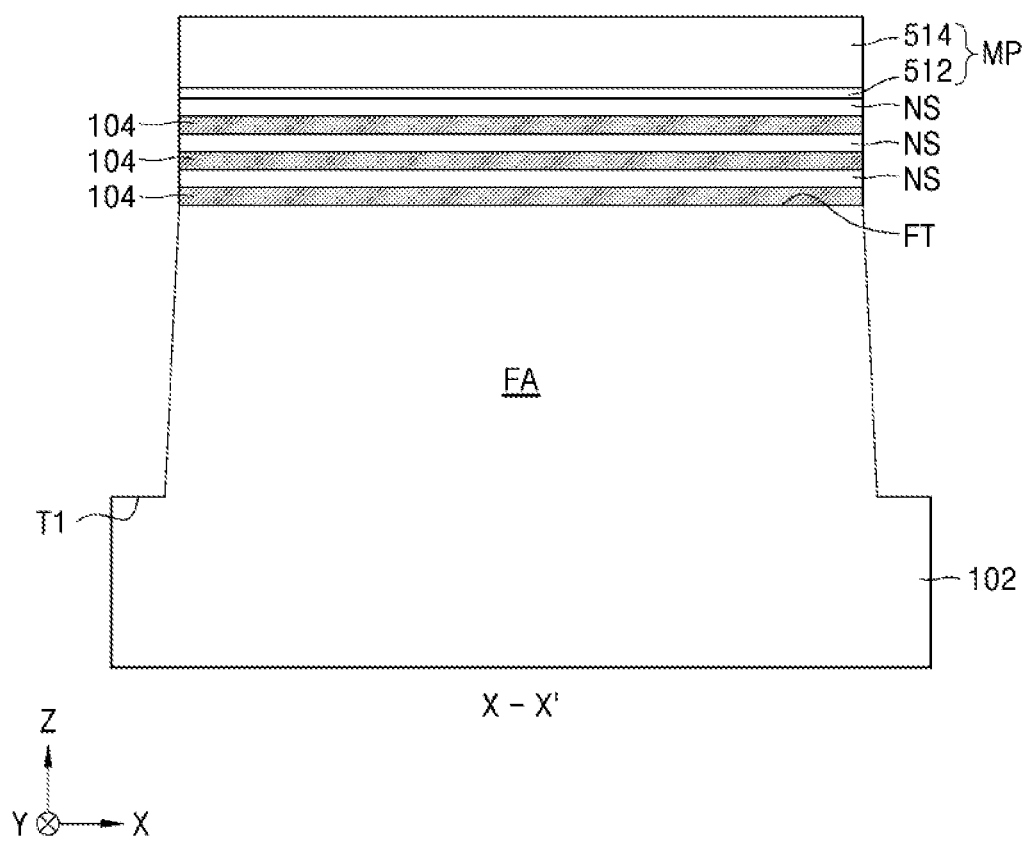

Referring to FIG. 12, a mask pattern MP may be formed on a stacked structure of the plurality of sacrificial semiconductor layers 104 and the plurality of nanosheet semiconductor layers NS, and portions of the plurality of sacrificial semiconductor layers 104, the plurality of nanosheet semiconductor layers NS, and the substrate 102 may be etched to form a trench T1. The mask pattern MP may be formed by a photolithography process. The etching process may be an anisotropic etching process, e.g., a reactive ion etching (RIE) process. As a result, the fin-type active area FA defined by the trench T1 may be formed, and a stacked structure of the plurality of sacrificial semiconductor layers 104 and the plurality of nanosheet semiconductor layers NS may be left on the fin top surface FT of the fin-type active area FA.

The mask pattern MP and the fin-type active area FA may have a line pattern extending in the X direction. The mask pattern MP may include a pad oxide layer pattern 512 and a hardmask pattern 514. The hardmask pattern 514 may include, for example, silicon nitride ($Si_3N_4$), polysilicon (Si), a spin-on hardmask (SOH) material, or a combination thereof. The SOH material may include a hydrocarbon compound having a relatively high carbon content of about 85% to about 99% by weight based on a total weight of the SOH material.

Figure 13:
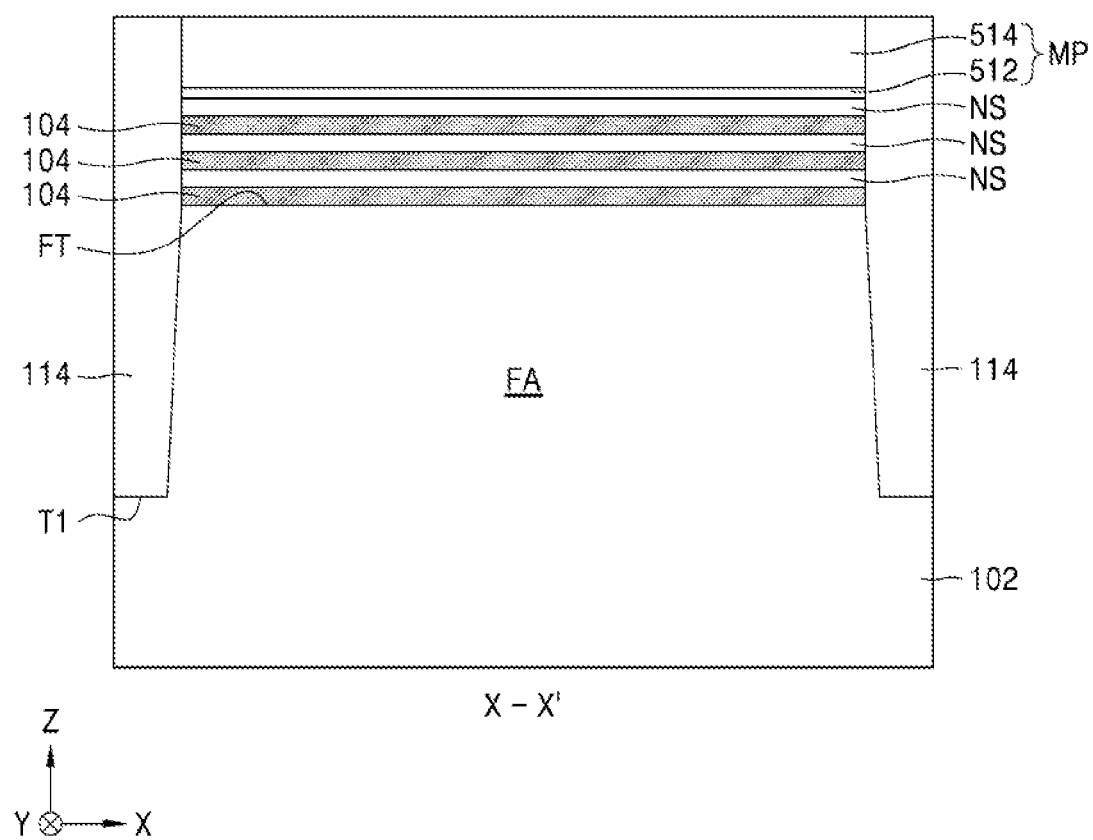

Referring to FIG. 13, the device isolation layer 114 may be formed in the trench T1.

Figure 14:
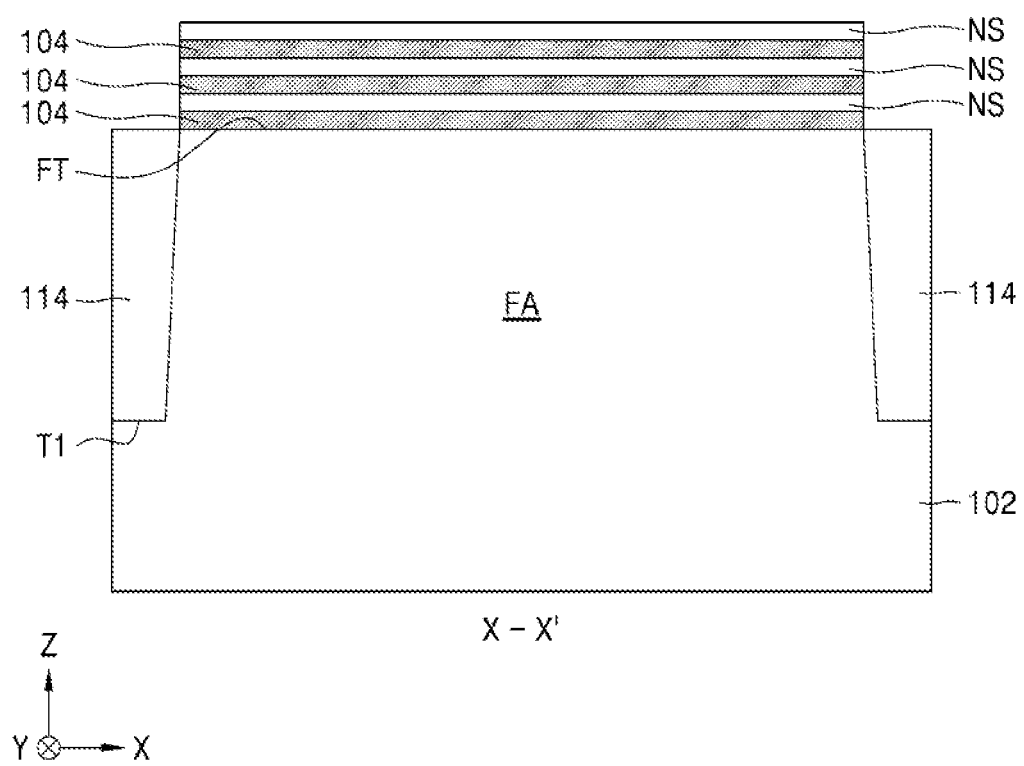

Referring to FIG. 14, the mask pattern MP may be removed from a resulting structure of the process illustrated in FIG. 13. Thereafter, a portion of the device isolation layer 114 may be removed, and a height of a top surface of the device isolation layer 114 may be substantially equal to or similar to a height of the fin top surface FT of the fin-type active area FA.

Figure 15:
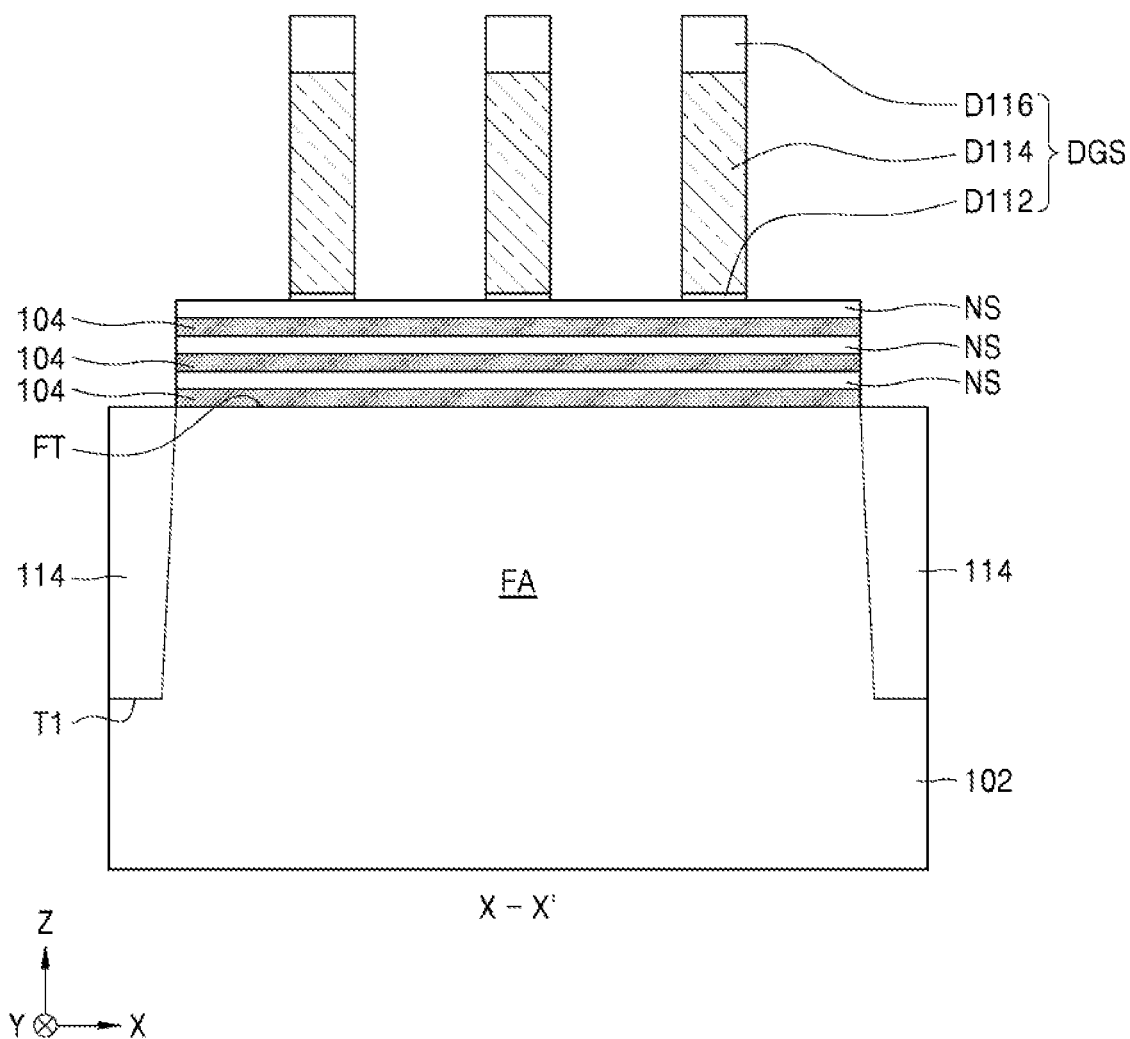

Referring to FIG. 15, a plurality of dummy gate structures DGS may be formed on the stacked structure of the plurality of sacrificial semiconductor layers 104 and the plurality of nanosheet semiconductor layers NS which remain on the fin-type active area FA.

Each of the plurality of dummy gate structures DGS may extend in a direction intersecting the fin-type active area FA.

Each of the plurality of dummy gate structures DGS may have a structure in which an oxide layer D112, a dummy gate layer D114, and a capping layer D116 are sequentially stacked. In an exemplary embodiment of the present inventive concept, the oxide layer D112 may include silicon oxide ($SiO_2$), the dummy gate layer D114 may include polysilicon (Si), and the capping layer D116 may include a silicon nitride ($Si_3N_4$) layer.

Figure 16A:
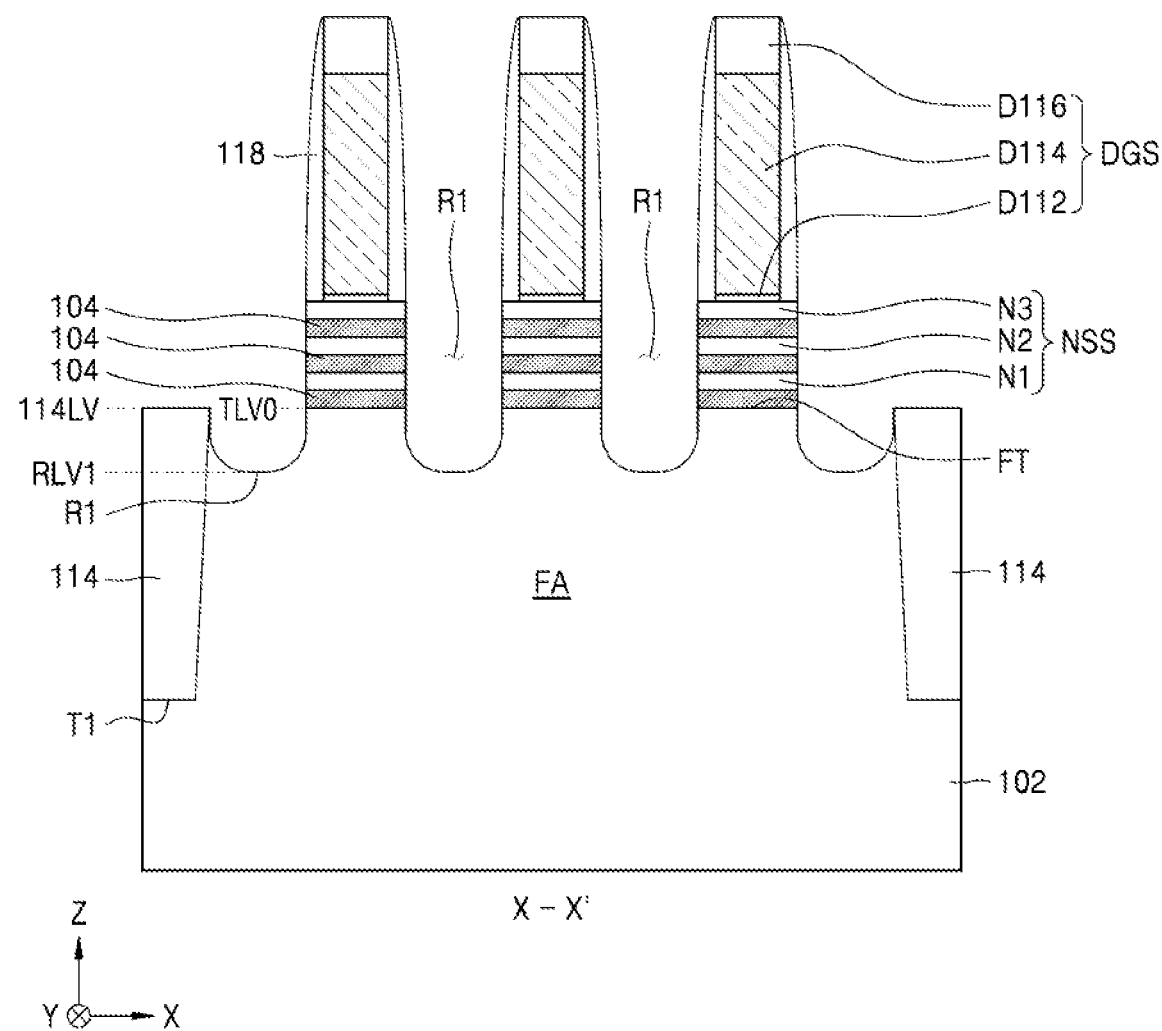
Figure 16B:
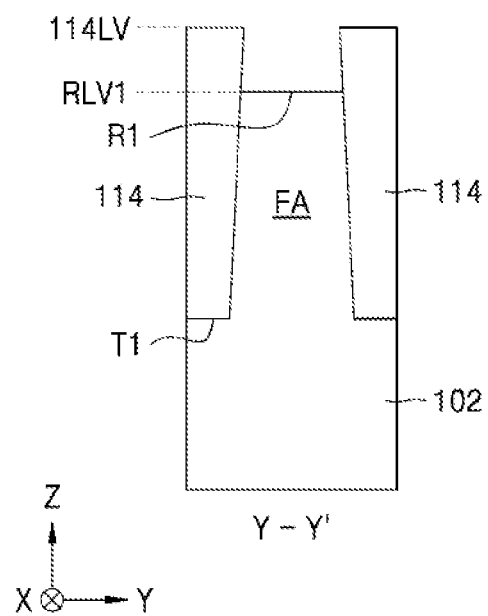

Referring to FIGS. 16A and 16B, a plurality of first insulation spacers 118 may be formed to cover both side walls of each of the plurality of dummy gate structures DGS. For example, a first spacer layer may be conformally formed on the substrate 102 having the plurality of dummy gate structures DGS thereon, and may be anisotropically etched to form the plurality of first insulation spacers 118 covering each of opposite sidewalls of each of the plurality of dummy gate structures DGS in the first horizontal direction (X direction). Thereafter, portions of each of the plurality of sacrificial semiconductor layers 104 and the plurality of nanosheet semiconductor layers NS may be removed by using the plurality of dummy gate structures DGS and the plurality of first insulation spacers 118 as etching masks, and the plurality of nanosheet semiconductor layers NS may be divided into the plurality of nanosheet stacks NSS including the plurality of nanosheets (N1, N2, and N3). Thereafter, the fin-type active area FA exposed at a side or between two adjacent ones of the plurality of nanosheet stacks NSS may be etched to form the plurality of anti-punch-through recesses R1 on the top surface of the fin-type active area FA. The lowermost level RLV1 of the plurality of anti-punch-through recesses R1 may be lower than a level TLV0 of the fin top surface FT of the fin-type active area FA, and may be lower than a level 114LV of the top surface of the device isolation layer 114. The fin-type active area FA may be etched by using, for example, a dry etching, a wet etching, or a combination thereof to form the plurality of anti-punch-through recesses R1.

Figure 17:
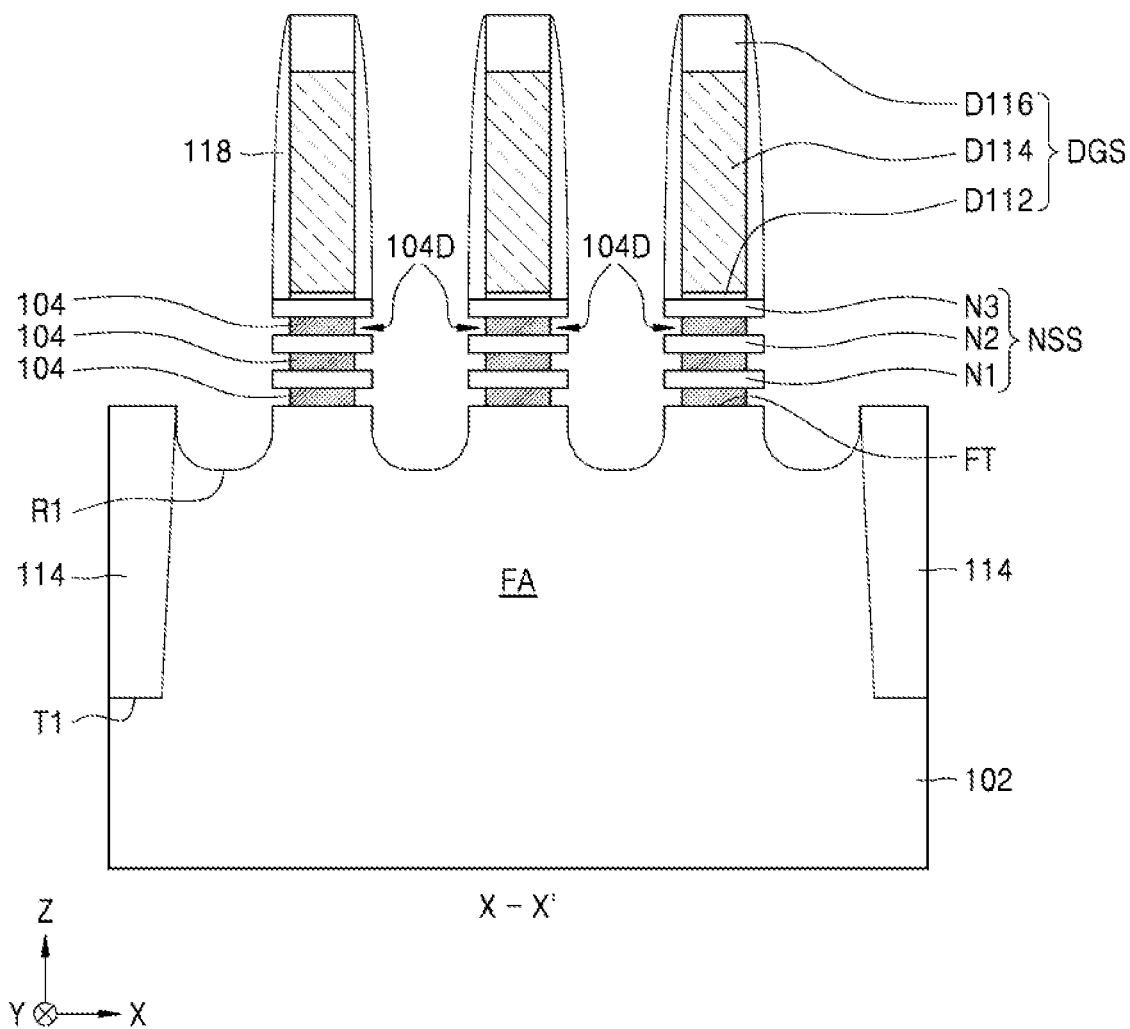

Referring to FIG. 17, a portion of the plurality of sacrificial semiconductor layers 104 exposed at both sides of each of the plurality of nanosheet stacks NSS may be removed to form a plurality of indented regions 104D between each two adjacent ones of the plurality of nanosheets (N1, N2, and N3) and between the first nanosheet N1 and the fin top surface FT of the fin-type active area FA.

To form the plurality of indented regions 104D, portions of the plurality of sacrificial semiconductor layers 104 may be selectively etched by using an etching selectivity difference between the plurality of sacrificial semiconductor layers 104 and the plurality of nanosheets (N1, N2, and N3). In an exemplary embodiment of the present inventive concept, the plurality of indented regions 104D may be formed by a wet etching process. Thus, each of the plurality of indented regions 104D may have a convex shape toward a central portion of each of the plurality of sacrificial semiconductor layers 104 in the first horizontal direction (X direction).

Figure 18:
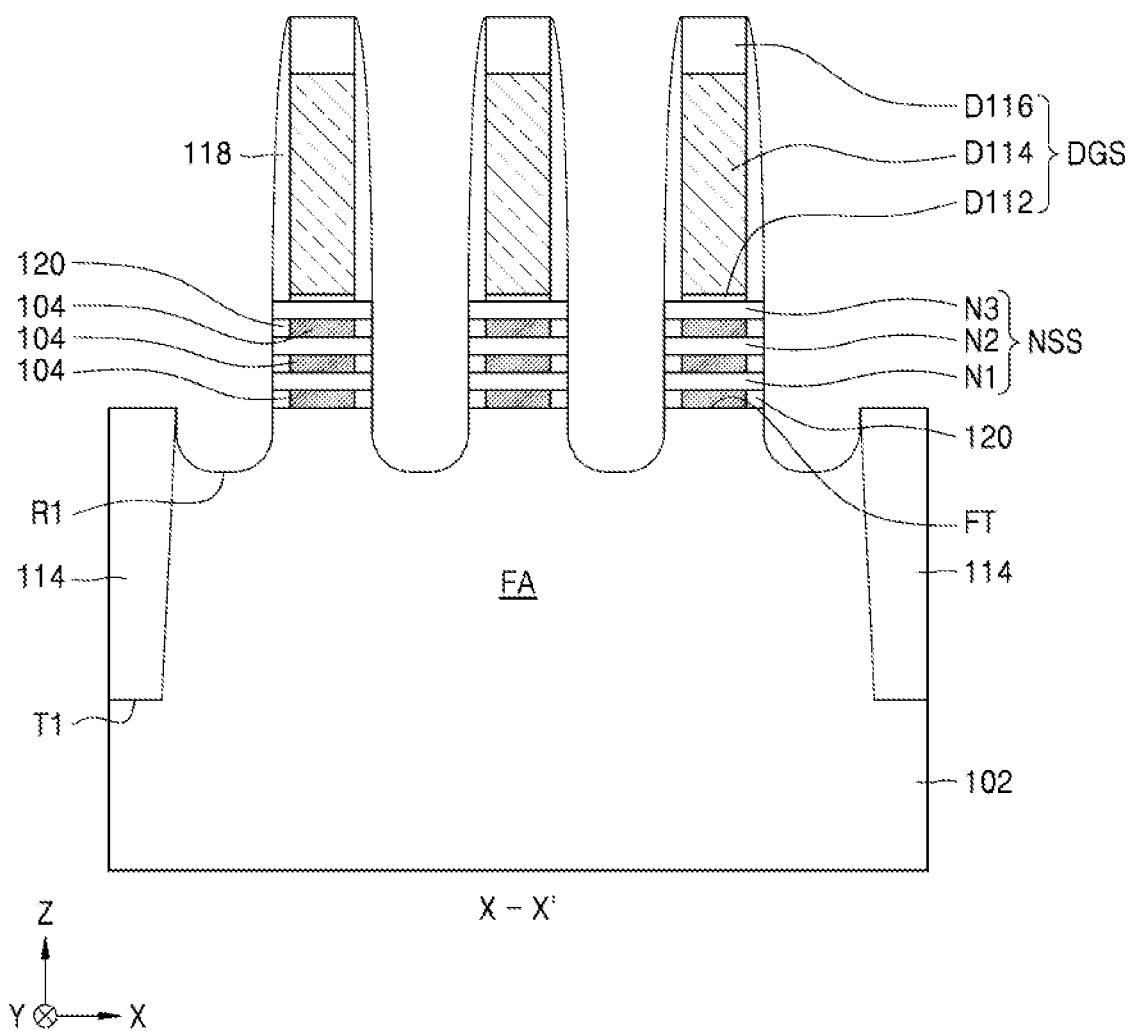

Referring to FIG. 18, the plurality of second insulating spacers 120 which respectively fill the plurality of indented regions 104D in FIG. 17 may be formed. To form the plurality of second insulating spacers 120, a process such as, for example, an atomic layer deposition (ALD) process, a chemical vapor deposition (CVD) process, an oxidation process, or a combination thereof may be used. The plurality of second insulating spacers 120 may be formed by conformally forming a second insulating spacer layer on the plurality of dummy gate structures DGS, the plurality of first insulation spacers 118, the plurality of nanosheet stacks NSS, the fin-type active area FA of the substrate 102, and the device isolation layer 114, and anisotropically etching the second insulating spacer layer.

Figure 19A:
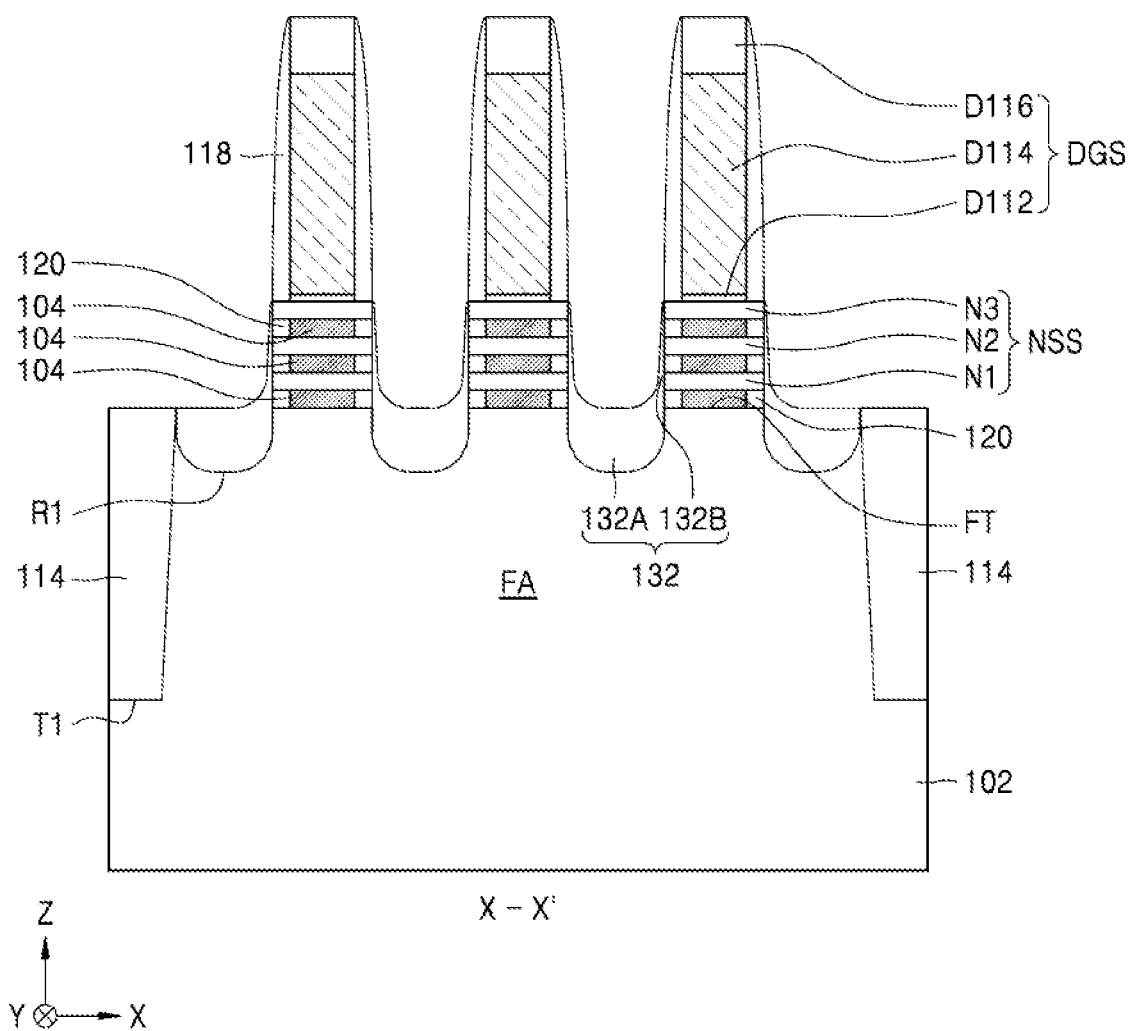
Figure 19B:
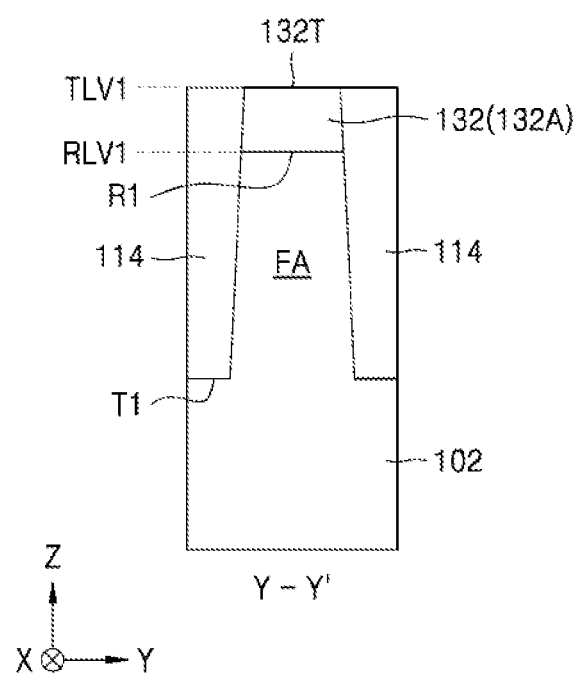

Referring to FIGS. 19A and 19B, the plurality of anti-punch-through semiconductor layers 132 which respectively fill the plurality of anti-punch-through recesses R1 may be formed. Each of the plurality of anti-punch-through semiconductor layers 132 may include a first portion 132A filling the anti-punch-through recess R1, and a second portion 132B covering at least some of side walls among the plurality of nanosheets (N1, N2, and N3) outside the anti-punch-through recess R1.

In an exemplary embodiment of the present inventive concept, to form the plurality of anti-punch-through semiconductor layers 132, a process such as, for example, a low-pressure chemical vapor deposition (LPCVD) process using a precursor containing Si and/or Ge, a selective epitaxial growth (SEG) process, or a cyclic deposition and etching (CDE) process may be performed. In an exemplary embodiment of the present inventive concept, to form the plurality of anti-punch-through semiconductor layers 132 including Si, a gas including Si such as, for example, disilane ($Si_2H_6$), trisilane ($Si_3H_8$), and/or dichlorosilane ($SiH_2Cl_2$) may be used as a Si source. To form the plurality of anti-punch-through semiconductor layers 132 including SiGe, a gas mixture of a gas including Ge such as germane ($GeH_4$) and a gas including Si such as dichlorosilane ($SiH_2Cl_2$) may be used. In an exemplary embodiment of the present inventive concept, to form a plurality of anti-punch-through semiconductor layers 132 by using the CDE process, an epitaxial growth process using the gas including Si and/or the gas including Ge and an etching process using an hydrochloric acid (HCl) gas or chlorine ($Cl_2$) gas as an etching gas may be performed alternately. When the plurality of anti-punch-through semiconductor layers 132 include a semiconductor layer doped with a dopant, a doping process may be performed in situ during the epitaxial growth process.

Figure 20A:
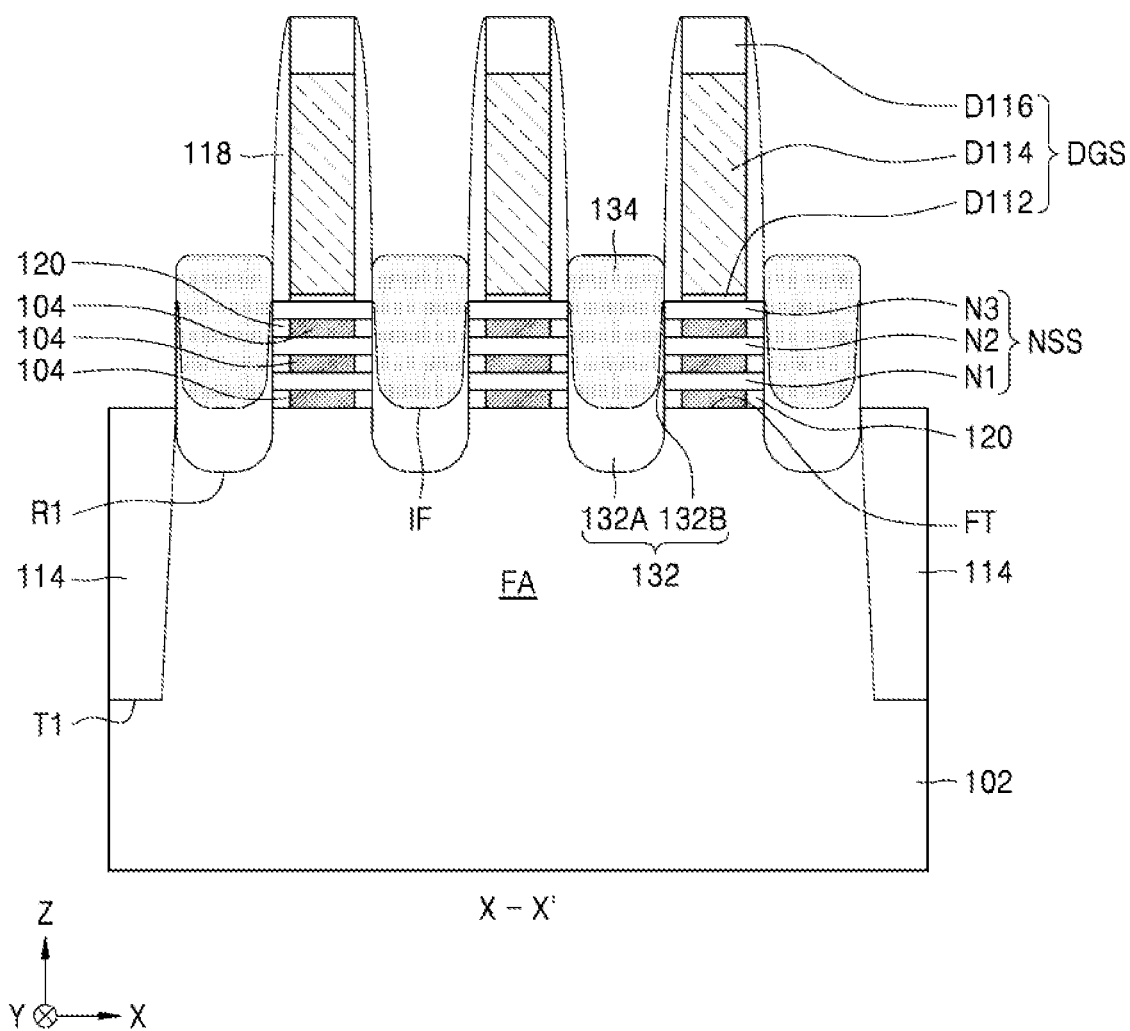
Figure 20B:
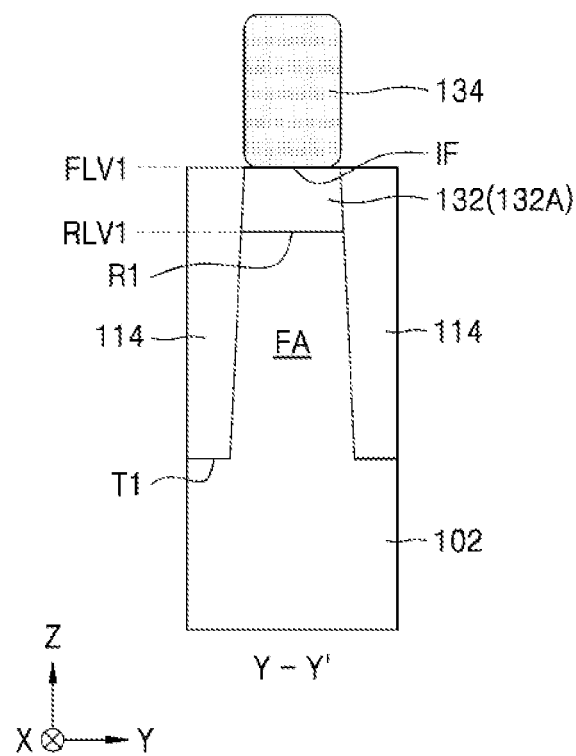

Referring to FIGS. 20A and 20B, the plurality of source/drain regions 134 may be formed by epitaxial growth of semiconductor material from exposed surfaces of the plurality of anti-punch-through semiconductor layers 132. For example, the exposed surfaces of the plurality of anti-punch-through semiconductor layers 132 may be served as a seed for the SEG process.

To form the plurality of source/drain regions 134, the LPCVD process, the SEG process, or the CDE process using a precursor including Si and/or Ge may be performed. After the plurality of source/drain regions 134 are formed, an interface IF where the anti-punch-through semiconductor layer 132 and the source/drain region 134 contact each other may be formed. A level FLV1 of the interface IF vertically overlapping the lowermost portion at the lowermost level of the inner wall of the anti-punch-through recess R1 may be equal to or lower than the level TLV0 of the fin top surface FT of the fin-type active area FA (refer to FIG. 16A).

Figure 21:
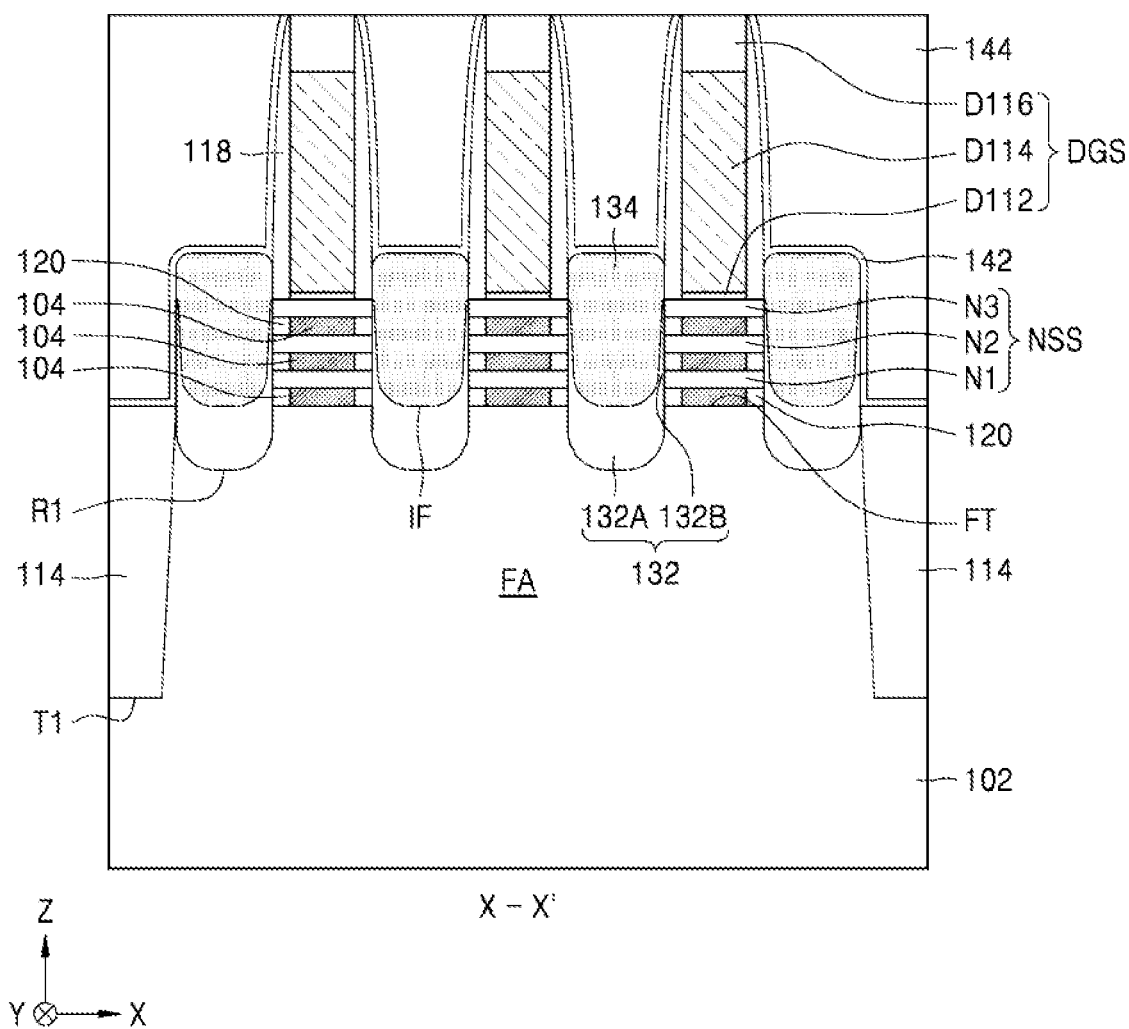

Referring to FIG. 21, after the protective insulation layer 142 is formed to cover a resulting structure in which the plurality of source/drain regions 134 is formed, and the inter-gate insulation layer 144 is formed on the protective insulation layer 142, the protective insulation layer 142 and the inter-gate insulation layer 144 may be planarized to expose the top surface of the capping layer D116. The planarization process may be performed by a chemical mechanical polishing (CMP) process and/or an etch back process.

Figure 22:
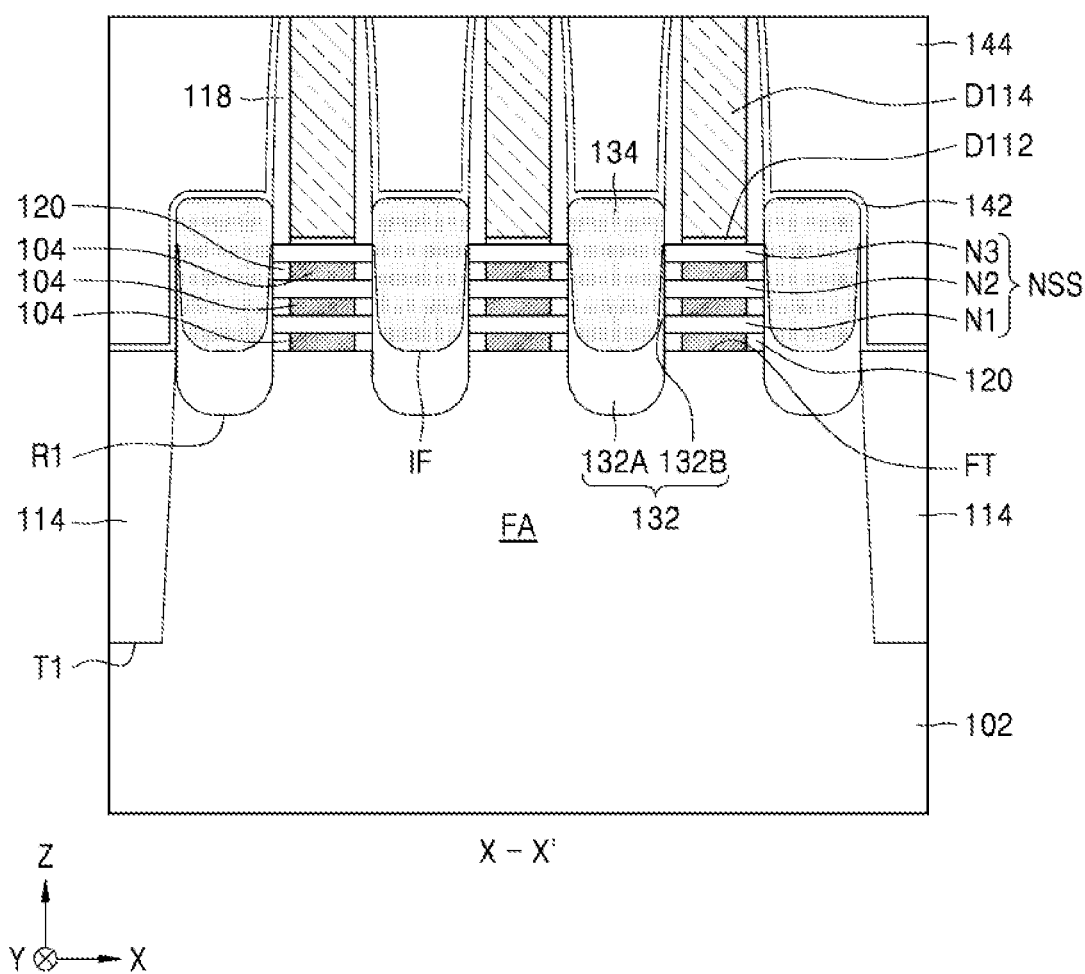

Referring to FIG. 22, the capping layer D116 may be removed from the resulting structure of the process illustrated in FIG. 21 to expose the dummy gate layer D114. Thereafter, portions of the protective insulation layer 142 and the inter-gate insulation layer 144 may be removed to make the top surface of the inter-gate insulation layer 144 and the top surface of the dummy gate layer D114 to be substantially coplanar with each other.

Figure 23:
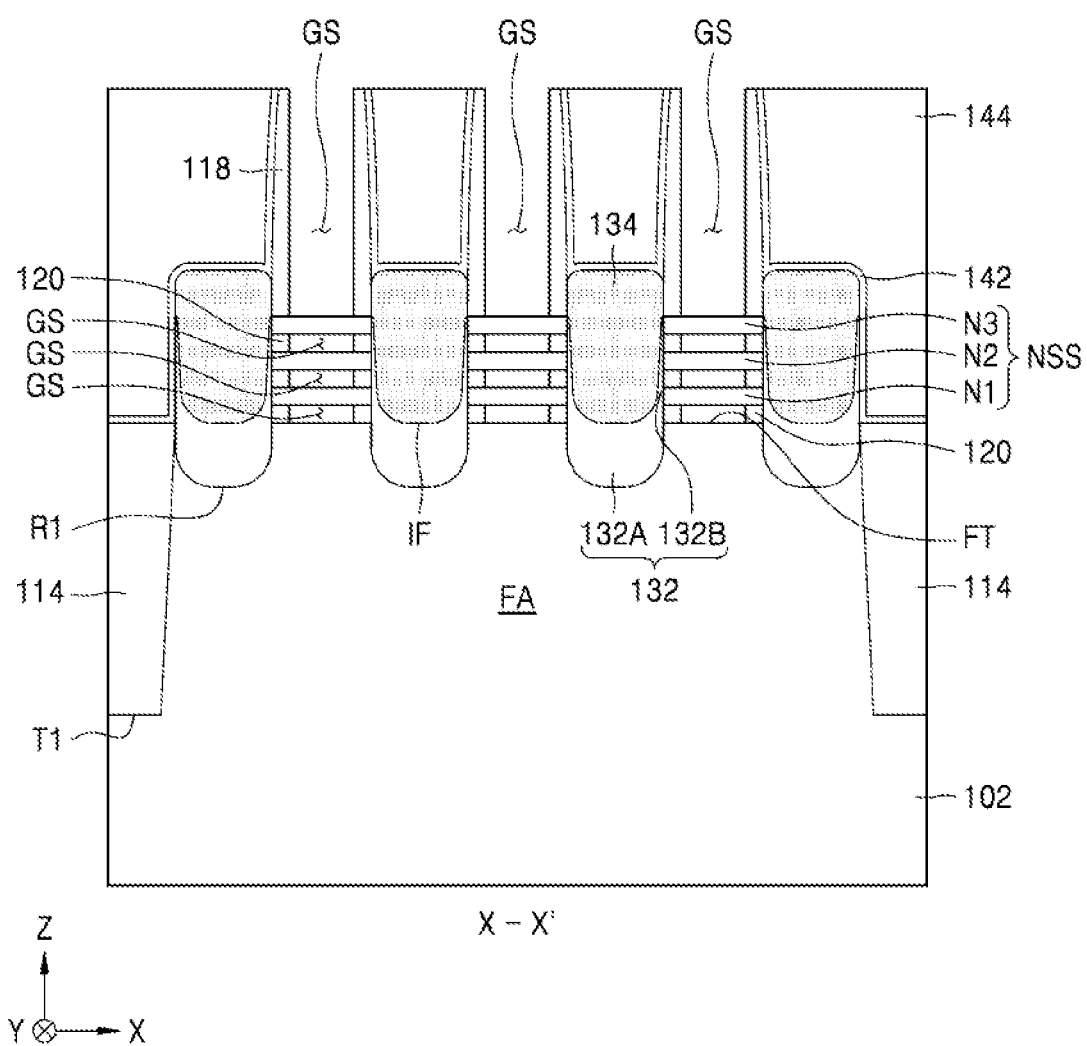

Referring to FIG. 23, the dummy gate layer D114 and the underlying oxide layer D112 may be removed by, for example, a wet etching process and/or a dry etching process from the resulting structure of the process illustrated in FIG. 22 to provide a gate space GS, and the plurality of nanosheet stacks NSS may be exposed by the gate space GS. Thereafter, the plurality of sacrificial semiconductor layers 104 remaining on the fin-type active area FA may be removed by, for example, a wet etching process and/or a dry etching process through the gate space GS, and the gate space GS may extend into spaces between each two adjacent ones of the plurality of nanosheets (N1, N2, and N3) and the space between the first nanosheet N1 and the fin-type active area FA.

Figure 24:
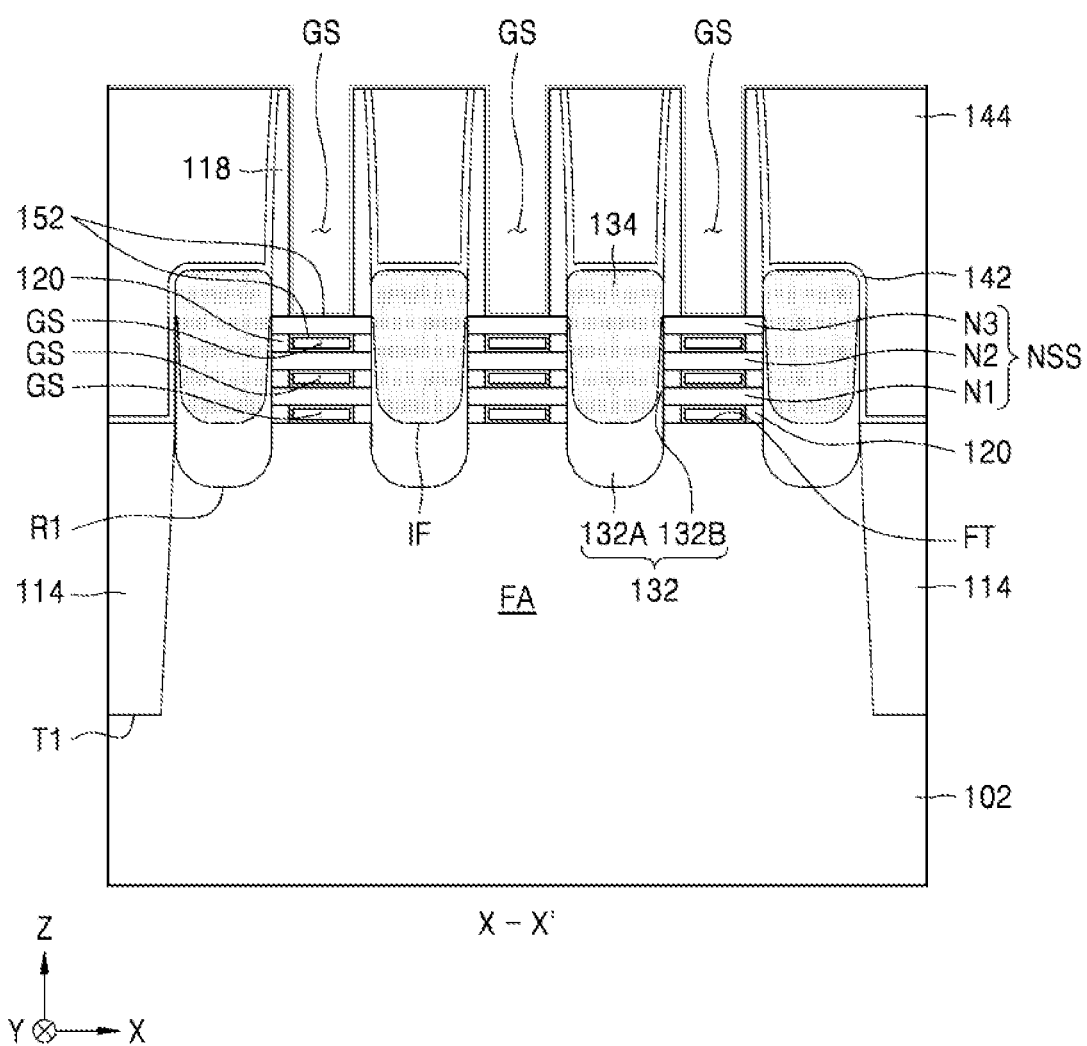

Referring to FIG. 24, the gate dielectric layer 152 may be formed to cover the exposed surfaces of the plurality of nanosheets (N1, N2, and N3) and the fin-type active area FA. The ALD process may be used to form the gate dielectric layer 152.

Figure 25:
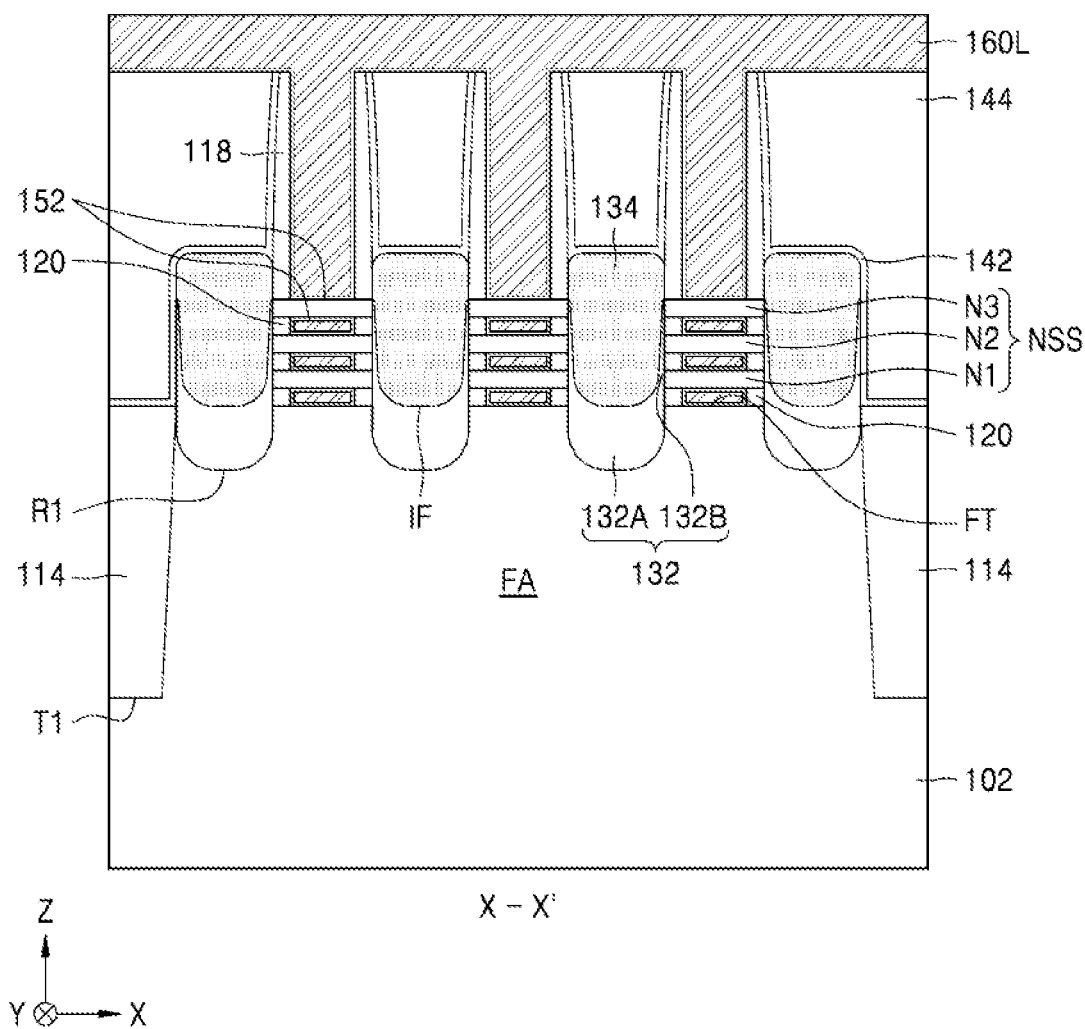

Referring to FIG. 25, a gate forming conductive layer 160L, which covers the top surface of the inter-gate insulation layer 144 while filling the gate space GS (refer to FIG. 24) on the gate dielectric layer 152, may be formed. The gate forming conductive layer 160L may include, for example, a metal, a metal nitride, a metal carbide, or a combination thereof. The ALD process may be used to form the gate forming conductive layer 160L.

Figure 26:
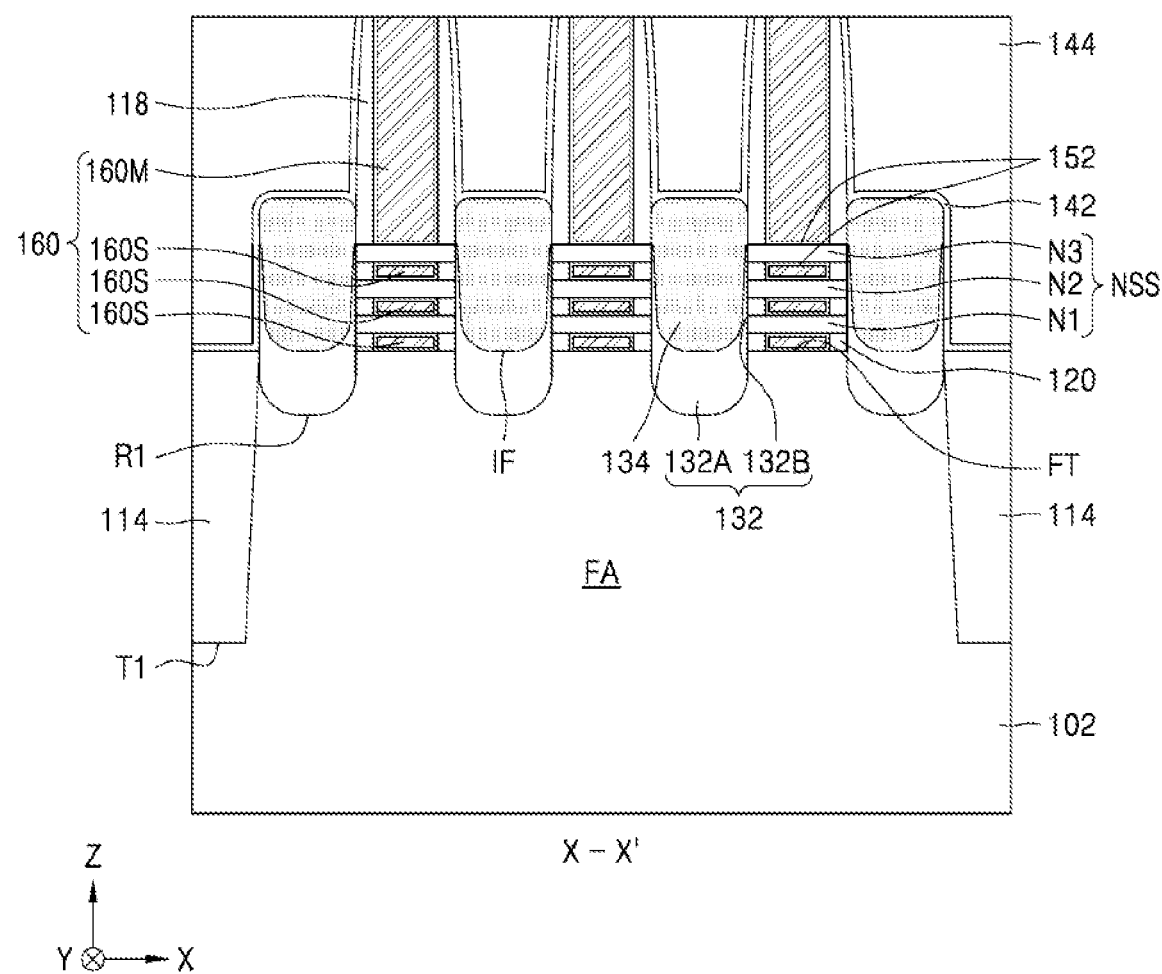

Referring to FIG. 26, the plurality of gate lines 160 may be formed by removing a portion of the gate forming conductive layer 160L of the resulting structure of the process illustrated in FIG. 25 from the top surface of the gate forming conductive layer 160L such that the top surface of the inter-gate insulation layer 144 is exposed. Each of the plurality of gate lines 160 may include the main gate portion 160M and the plurality of sub-gate portions 160S. As the planarization process is performed during the formation of the plurality of gate lines 160, the height of each of the protective insulation layer 142 and the inter-gate insulation layer 144 may be reduced. The planarization process may be performed by a CHIP process and/or an etch back process.

Figure 27A:
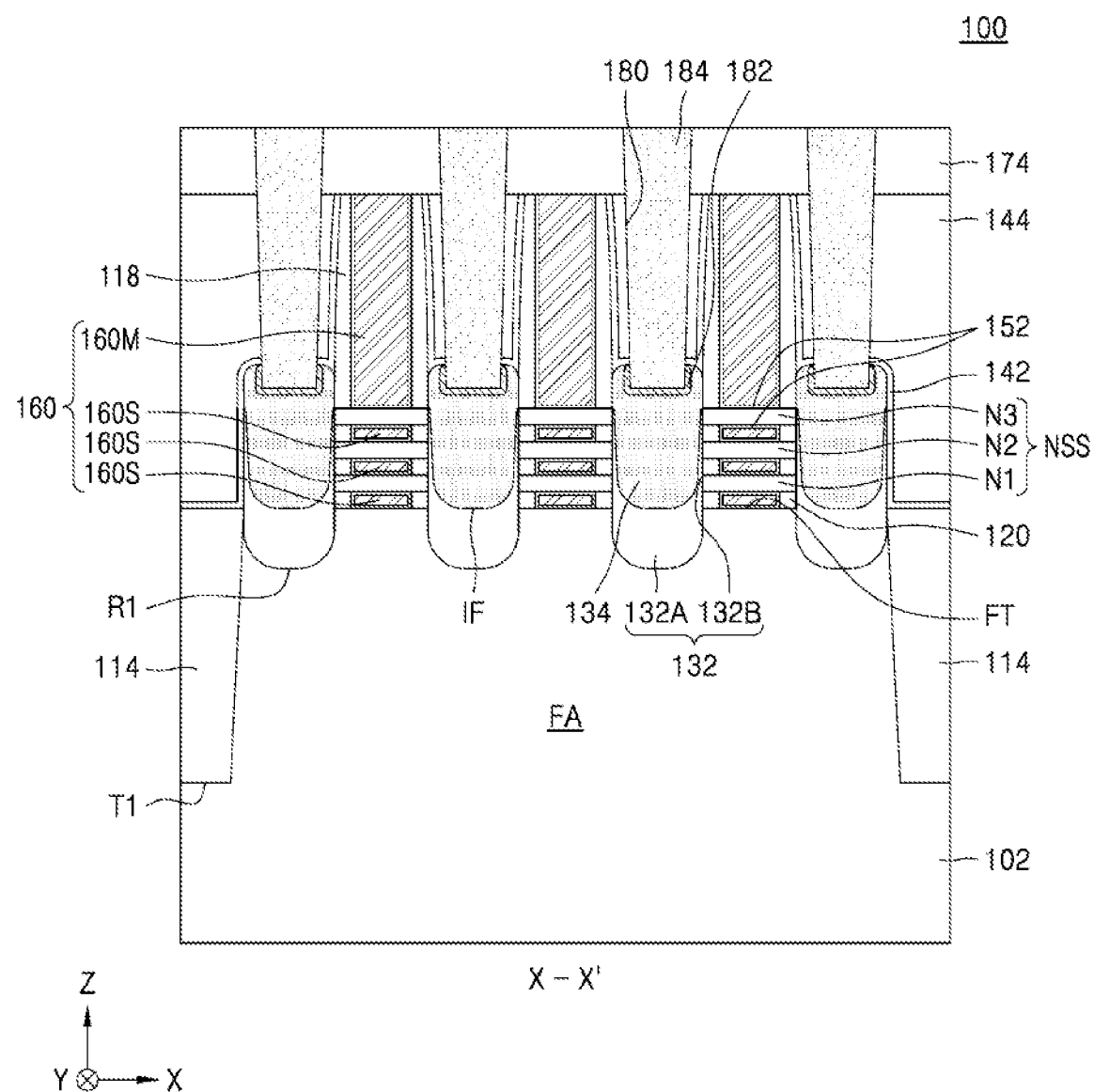
Figure 27B:
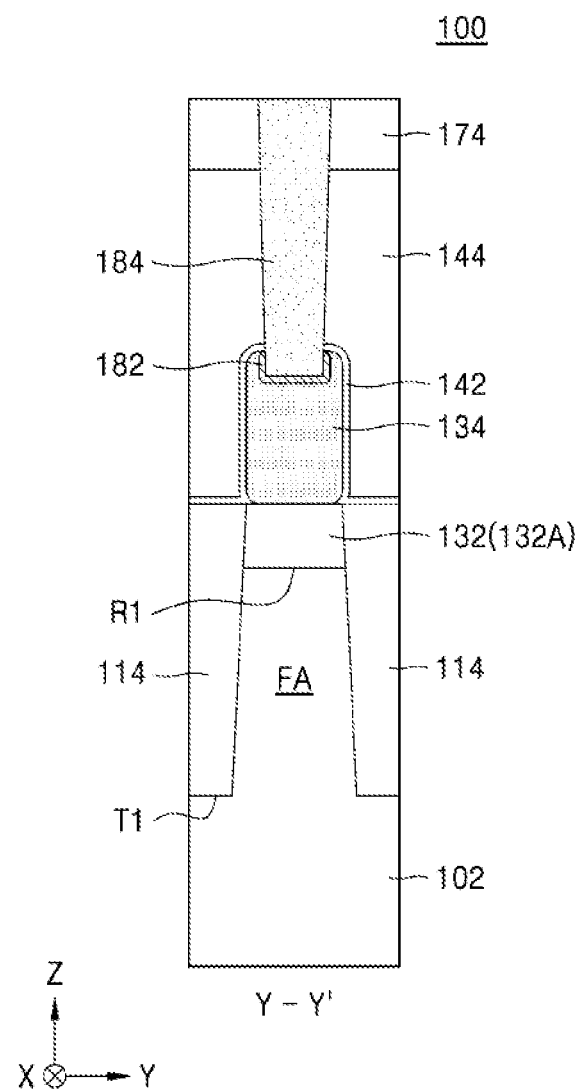

Referring to FIGS. 27A and 27B, after the inter-layer insulation layer 174 covering the plurality of gate lines 160 is formed, the plurality of contact holes 180 exposing the plurality of source/drain regions 134 may be formed by partially etching the inter-layer insulation layer 174, the inter-gate insulation layer 144, and the protective insulation layer 142. The metal silicide layer 182, for providing low contact resistance between the source/drain region 134 and the contact plug 184, may be formed on each of the plurality of source/drain regions 134 exposed by the plurality of contact holes 180, and the contact plug 184 filling the contact hole 180 on the metal silicide layer 182 may be formed, and accordingly, the integrated circuit device 100 illustrated in FIGS. 2A and 2B may be formed.

According to the method of manufacturing the integrated circuit device 100 described with reference to FIGS. 11 through 27B, the structure in which the anti-punch-through semiconductor layer 132 is between the fin-type active area FA and the source/drain region 134 may be relatively easily formed at a low manufacturing cost. Thus, a structure may be easily implemented, in which undesired punch-through via the fin-type active area FA at the bottom of the nanosheet stack NSS is effectively blocked by the anti-punch-through semiconductor layer 132.

The method described with reference to FIGS. 11 through 27B may be used to manufacture the integrated circuit device 200 illustrated in FIGS. 3A and 3B. However, in the process described with reference to FIGS. 20A and 20B, in place of the plurality of source/drain regions 134, the source/drain region 234 including the first semiconductor layer 234A and the second semiconductor layer 234B, which have different dopant concentrations from each other may be formed. For example, the first semiconductor layer 234A may be formed to have a relatively low dopant concentration and may be close to the anti-punch-through semiconductor layer 132, and the second semiconductor layer 234B may be formed to have a relatively high dopant concentration and may be far away from the anti-punch-through semiconductor layer 132.

The method described with reference to FIGS. 11 through 27B may be used to manufacture the integrated circuit device 300 illustrated in FIGS. 4A and 4B. However, after forming the plurality of anti-punch-through semiconductor layers 132 as described with reference to FIGS. 19A and 19B, the respective side walls of the second and third nanosheets N2 and N3 of the plurality of nanosheets (N1, N2, and N3) or the respective side walls of the first to third nanosheets N1, N2 and N3 of the plurality of nanosheets (N1, N2, and N3) may be exposed through modifying the plurality of anti-punch-through semiconductor layers 132 by using a reflow process or an etching process with heat treatment. Thereafter, the plurality of source/drain regions 334 may be formed in a manner similar to the method described for the forming of the plurality of source/drain regions 134 with reference to FIGS. 20A and 20B. Thereafter, subsequent processes similar to the processes described with reference to FIGS. 21 through 27B may be performed. Accordingly, the anti-punch-through semiconductor layers 332 formed through the reflow process or the etching process with heat treatment may not contact the first, second and third nanosheets N1, N2 and N3, and each of the plurality of source/drain regions 334 may contact the first, second and third nanosheets N1, N2 and N3 as shown in FIG. 4A.

To manufacture the integrated circuit device 400 illustrated in FIG. 5, the method described with reference to FIGS. 11 through 27B may be used. Particularly, the plurality of anti-punch-through recesses R4 may be formed in a similar manner to the process of forming the plurality of anti-punch-through recesses R1 with reference to FIGS. 16A and 16B. However, when fin-type active area FA is etched to form the plurality of anti-punch-through recesses R4, the plurality of anti-punch-through recesses R4 may extend to the bottom of the nanosheet stack NSS in consideration of surface direction, etching conditions, etc. of the semiconductor material constituting the fin-type active area FA. Thereafter, subsequent processes similar to the processes described with reference to FIGS. 17A through 27B may be performed. For example, in the process of forming the plurality of anti-punch-through recesses R4 with reference to FIGS. 16A and 16B, an isotropic etching process may be performed to provide lateral etching in the first horizontal direction (X direction) such that the plurality of anti-punch-through recesses R4 may extend to the bottom of the nanosheet stack NSS as shown in FIG. 5.

The method described with reference to FIGS. 11 through 27B may be used to manufacture the integrated circuit devices 500 and 600 illustrated respectively in FIGS. 6 and 7. Particularly, to form the plurality of anti-punch-through recesses R5, the manufacturing method of the integrated circuit device 400 illustrated in FIG. 5 may be referred to. For example, the plurality of anti-punch-through recesses R5 may be formed to extend to the bottom of the nanosheet stack NSS. In addition, to form the plurality of anti-punch-through semiconductor layers 532 and 632, after the plurality of anti-punch-through semiconductors 532 and 632 filling the plurality of anti-punch-through recesses R5 in a similar manner to the processes described with reference to FIGS. 19A and 19B are formed, a reflow process or an etching process with heat treatment may be performed. Thereafter, subsequent processes similar to the processes described with reference to FIGS. 20 through 27B may be performed.

The method described with reference to FIGS. 11 through 27B may be used to manufacture the integrated circuit devices 700 and 800 illustrated respectively in FIGS. 8 and 9. However, in the process described with reference to FIG. 11, when the plurality of sacrificial semiconductor layers 104 and the plurality of nanosheet semiconductor layers NS are formed on the substrate 102, four sacrificial semiconductor layers 104 and four nanosheet semiconductor layers NS may be alternately stacked one by one. Thereafter, processes similar to those described with reference to FIGS. 12 through 27B, or subsequent processes which have been variously modified and changed within the spirit and scope of the present inventive concept may be performed.

The substrate 102 including the first region I and the second region II may be prepared for manufacturing the integrated circuit device 900 illustrated in FIGS. 10A and 10B. Thereafter, methods described with reference to FIGS. 11 through 27B, or methods which have been variously modified and changed within the spirit and scope of the present inventive concept may be used. In the integrated circuit devices 100 to 900, three nanosheets N1, N2 and N3, or four nanosheets N1, N2, N3 and N4 are exemplarily shown in various exemplary embodiments of the present inventive concept, but the present inventive concept is not limited thereto. For example, an integrated circuit device having two nanosheets, or five or more nanosheets may also be formed without departing from the spirit and scope of the present inventive concept.

While the present inventive concept has been particularly shown and described with reference to exemplary embodiments thereof, it will be understood that various changes in form and details may be made therein without departing from the spirit and scope of present inventive concept as defined in the appended claims.

What is claimed is:

1. A method of manufacturing an integrated circuit device, the method comprising:
   forming a fin-type active area protruding from a substrate and having a fin top surface, and a nanosheet stack facing the fin top surface at a location apart from the fin top surface and comprising a plurality of nanosheets;
   forming an anti-punch-through recess comprising a bottom surface thereof at a level lower than a level of the fin top surface by etching the fin-type active area on one side of the nanosheet stack;
   forming an anti-punch-through semiconductor layer filling the anti-punch-through recess from the bottom surface thereof extending upward to cover a side wall of at least one of the plurality of nanosheets; and forming a source/drain region on the anti-punch-through semiconductor layer, the source/drain region comprising a material different from a material of the anti-punch-through semiconductor layer, wherein the anti-punch-through semiconductor layer includes a top portion and a bottom portion and wherein a width of the top portion is narrower than a width of the bottom portion and the top portion contacts the sidewalls of the plurality of nanosheets and the bottom portion does not contact the sidewalls of the plurality of nanosheets.

2. The method of claim 1, wherein
the anti-punch-through semiconductor layer is formed of an undoped semiconductor layer, and
the source/drain region is formed of a dopant-doped semiconductor layer.

3. The method of claim 1, wherein,
in the forming of the anti-punch-through semiconductor layer, the anti-punch-through semiconductor layer is formed of a semiconductor layer doped with a first conductivity type, and
in the forming of the source/drain region, the source/drain region is formed of a semiconductor layer doped with a second conductivity type that is opposite to the first conductivity type.

4. The method of claim 1, wherein,
in the forming of the anti-punch-through recess, the anti-punch-through recess is formed to extend to a bottom portion of the nanosheet stack, and
in the forming of the anti-punch-through semiconductor layer, the anti-punch-through semiconductor layer is formed to extend to the bottom portion of the nanosheet stack.

5. A method of manufacturing an integrated circuit device, the method comprising:
forming a fin-type active area protruding from a substrate and having a fin top surface, and a nanosheet stack facing the fin top surface at a location apart from the fin top surface and comprising a plurality of nanosheets;
forming an anti-punch-through recess comprising a bottom surface thereof at a level lower than a level of the fin top surface by etching the fin-type active area on one side of the nanosheet stack;
forming an anti-punch-through semiconductor layer filling the anti-punch-through recess and covering a side wall of at least one of the plurality of nanosheets; and
forming a source/drain region on the anti-punch-through semiconductor layer, the source/drain region comprising a material different from a material of the anti-punch-through semiconductor layer, wherein,
in the forming of the anti-punch-through semiconductor layer, the anti-punch-through semiconductor layer is formed to cover side walls of at least two nanosheets comprising a first nanosheet most adjacent to the fin-type active area among the plurality of nanosheets, and the method further comprises:
after forming the anti-punch-through semiconductor layer and before forming the source/drain region, exposing a side wall of one of the at least two nanosheets except for the first nanosheet by modifying the anti-punch-through semiconductor layer.

6. A method of manufacturing an integrated circuit device, the method comprising:
forming a fin-type active area protruding from a substrate, extending in a first horizontal direction, and having a fin top surface;
forming a pair of nanosheet stacks facing the fin top surface at a location apart from the fin top surface, the pair of nanosheet stacks each comprising a plurality of nanosheets having vertical distances different from each other from the fin top surface;
forming an anti-punch-through recess comprising a bottom surface thereof at a level lower than a level of the fin top surface by etching the fin-type active area between the pair of nanosheet stacks;
forming an anti-punch-through semiconductor layer filling the anti-punch-through recess;
forming a source/drain region on the anti-punch-through semiconductor layer, the source/drain region comprising a material different from a material of the anti-punch-through semiconductor layer; and
a pair of gate structures respectively covering the pair of nanosheet stacks and extending in a second horizontal direction perpendicular to the first horizontal direction,
wherein the anti-punch-through semiconductor layer comprises a first portion directly formed on the bottom surface of the anti-punch-through recess, and a second portion extending upward from the first portion and being in contact with a side wall of at least one of the pair of nanosheet stacks.

7. The method of claim 6, wherein
the anti-punch-through semiconductor layer is in contact with the source/drain region, and a lowermost level of an interface between the anti-punch-through semiconductor layer and the source/drain region is equal to or lower than the level of the fin top surface.

8. The method of claim 6, wherein
the anti-punch-through semiconductor layer is in contact with the source/drain region, and a lowermost level of an interface between the anti-punch-through semiconductor layer and the source/drain region is higher than the level of the fin top surface.

9. The method of claim 6, wherein
the source/drain region comprises a semiconductor layer doped with a first dopant of a first conductivity type, and
the anti-punch-through semiconductor layer comprises one selected from an undoped semiconductor layer and a semiconductor layer doped with a second dopant of a second conductivity type that is opposite to the first conductivity type.

\* \* \* \* \*